(12) United States Patent
Bao et al.

(10) Patent No.: US 9,960,254 B1
(45) Date of Patent: May 1, 2018

(54) REPLACEMENT METAL GATE SCHEME WITH SELF-ALIGNMENT GATE FOR VERTICAL FIELD EFFECT TRANSISTORS

(71) Applicant: INTERNATIONAL BUSINESS MACHINES CORPORATION, Armonk, NY (US)

(72) Inventors: Raqiang Bao, Niskayuna, NY (US); Dechao Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/424,937

(22) Filed: Feb. 6, 2017

(51) Int. Cl.
```
H01L 29/66       (2006.01)
H01L 29/40       (2006.01)
H01L 29/78       (2006.01)
H01L 29/08       (2006.01)
H01L 21/311      (2006.01)
```

(52) U.S. Cl.
CPC .. H01L 29/66666 (2013.01); H01L 21/31111 (2013.01); H01L 29/0847 (2013.01); H01L 29/401 (2013.01); H01L 29/6653 (2013.01); H01L 29/6656 (2013.01); H01L 29/66545 (2013.01); H01L 29/7827 (2013.01)

(58) Field of Classification Search
CPC ......... H01L 29/66666; H01L 29/66545; H01L 29/7827; H01L 21/31111; H01L 29/6656; H01L 29/6653

See application file for complete search history.

(56) References Cited

U.S. PATENT DOCUMENTS

| | | |
|---|---|---|
| 6,518,622 B1 | 2/2003 | Chew et al. |
| 6,664,143 B2 | 12/2003 | Zhang |
| 6,773,994 B2 | 8/2004 | Chittipeddi et al. |
| 7,033,877 B2 | 4/2006 | Chaudhry et al. |
| 7,446,025 B2 | 11/2008 | Cohen et al. |
| 8,664,060 B2 * | 3/2014 | Liu ................... H01L 29/66795 257/255 |

(Continued)

OTHER PUBLICATIONS

Campbell et al., "Trapezoidal-Groove Schottky-Gate Vertical-Channel GaAs FET (GaAs Static Induction Transistor)", IEEE Electron Device Letters. vol. EDL-6, Issue No. 6, Jun. 1985. pp. 304-306.

(Continued)

Primary Examiner — Savitr Mulpuri
(74) Attorney, Agent, or Firm — Tutunjian & Bitetto, P.C.; Vazken Alexanian

(57) ABSTRACT

A method is presented for forming a semiconductor structure. The method includes forming a fin structure over a substrate, forming a dummy gate over the fin structure, and etching the dummy gate by a first amount to expose a top portion of the fin structure. The method further includes forming a first dielectric layer adjacent the exposed top portion of the fin structure, forming a spacer adjacent the first dielectric layer contacting the fin structure, and etching the dummy gate by a second amount. The method further includes depositing a second dielectric layer to encapsulate the remaining dummy gate, depositing an inter-level dielectric (ILD) over the second dielectric layer, depositing at least one hard mask to access the dummy gate, stripping the dummy gate to form at least one recess, and filling the at least one recess with a high-k metal gate (HKMG).

10 Claims, 23 Drawing Sheets

(56) References Cited

U.S. PATENT DOCUMENTS 9,299,835 B1    3/2016    Anderson et al.
9,431,305 B1    8/2016    Anderson et al.
9,704,754 B1 *    7/2017    Bao ................. H01L 21/823437

OTHER PUBLICATIONS

Magerlein et al., "Characterization of GaAs self-aligned refractory-gate metal-semiconductor field-effect transistor (MESFET) integrated circuits", Journal of Applied Physics. vol. 61, Issue No. 8. Apr. 15, 1987. pp. 3080-3092.
Solomon et al., "Modulation-Doped GaAs/AlGaAs Heterojunction Field-Effect Transistors (MODFET's), Ultrahigh-Speed Device for Supercomputers", IEEE Transactions on Electron Devices, vol. ED-31, No. 8. Aug. 1984. pp. 1015-1027.
Yakimets et al., "Vertical GAAFETs for the Ultimate CMOS Scaling", IEEE Transactions of Electron Devices, vol. 62, No. 5. May 2015. pp. 1433-1439.
Yoh et al., "A P-Channel GASB Heterojunction Field-Effect Transistor Based on a Vertically Integrated Complementary Circuit Structure", Web of Science—Web of Science Core Collection Full Record. http://apps.webofknowledge. com.ezproxy.bu.edu/InboundService. Abstract download Oct. 4, 2016. pp. 1-2.

* cited by examiner

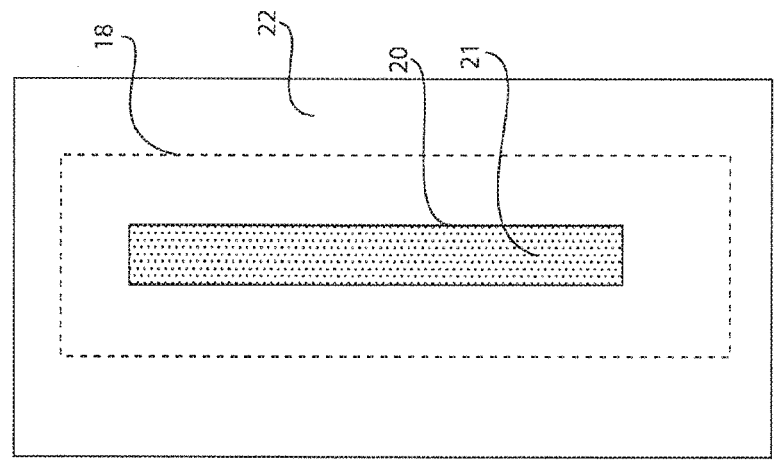
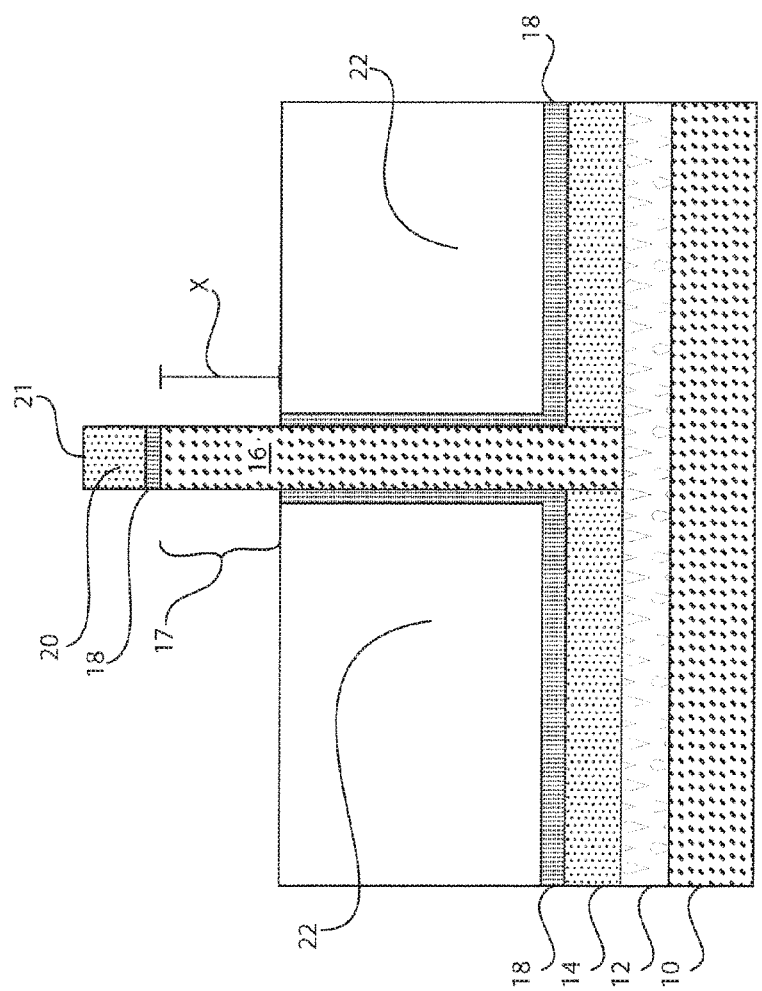

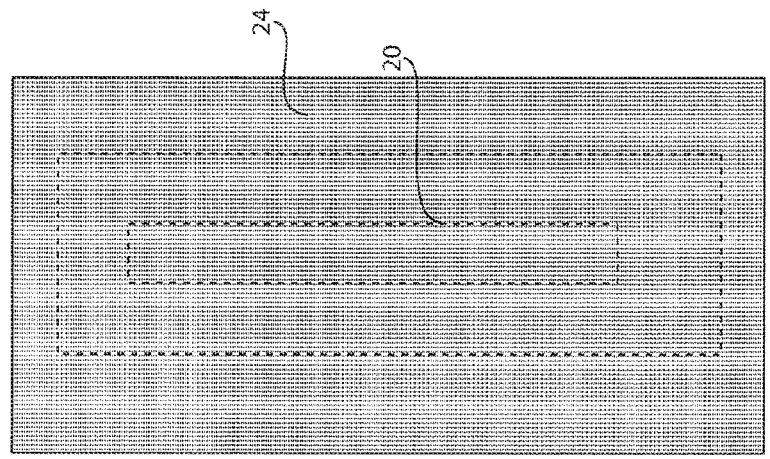
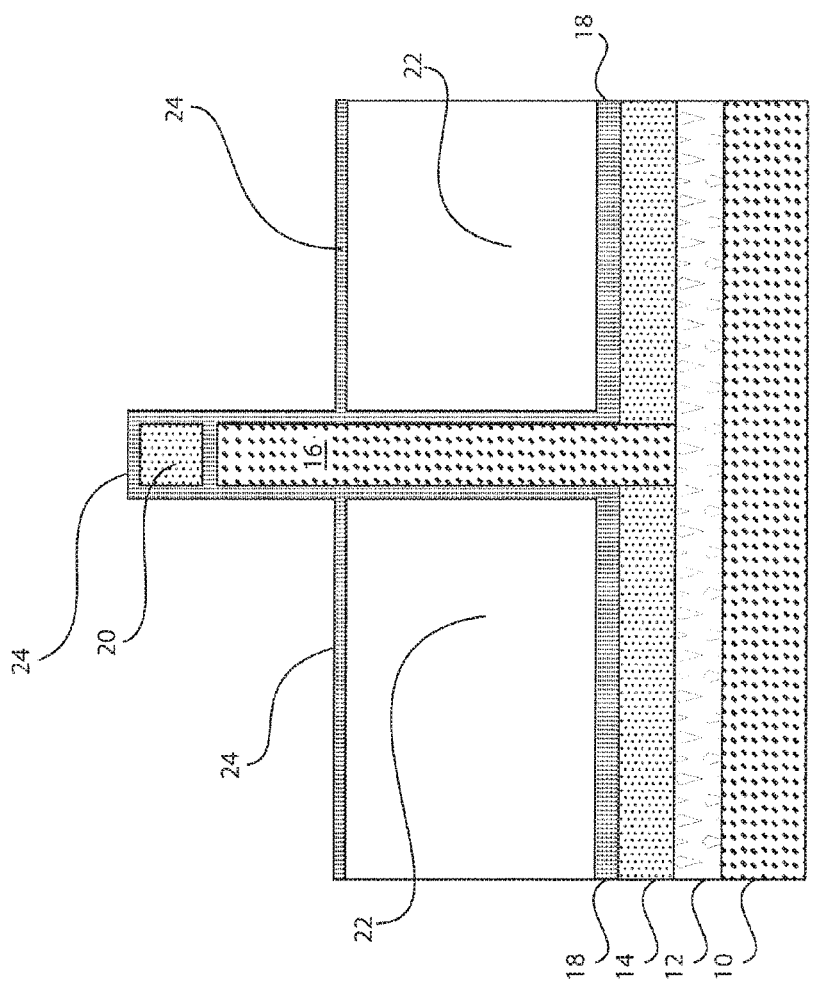

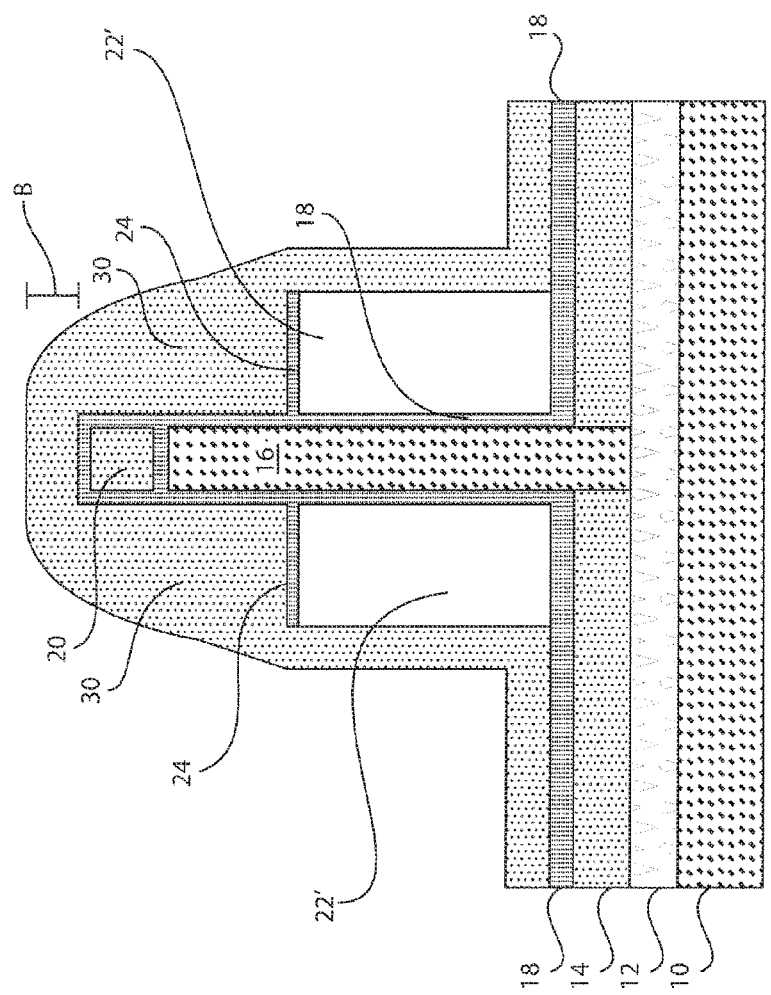
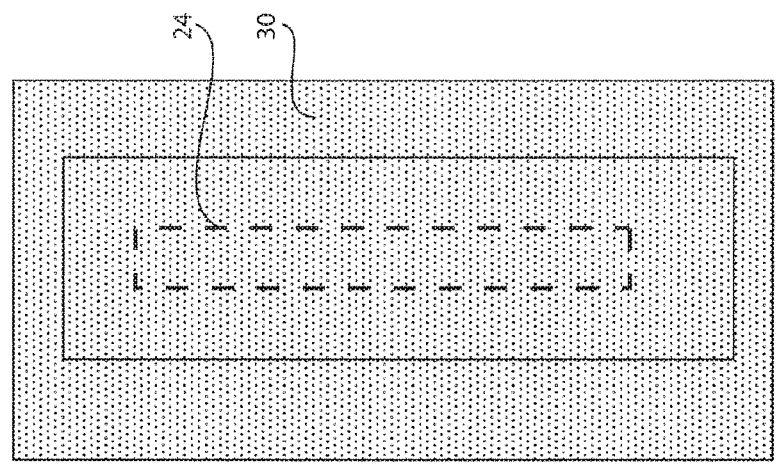
FIG. 15
FIG. 16

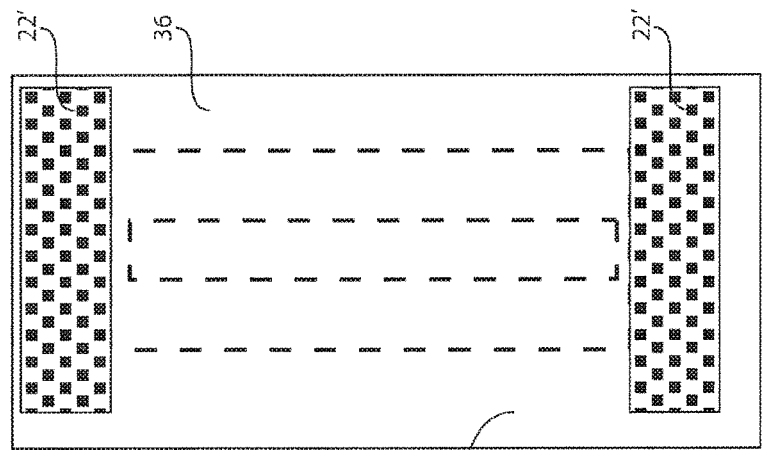
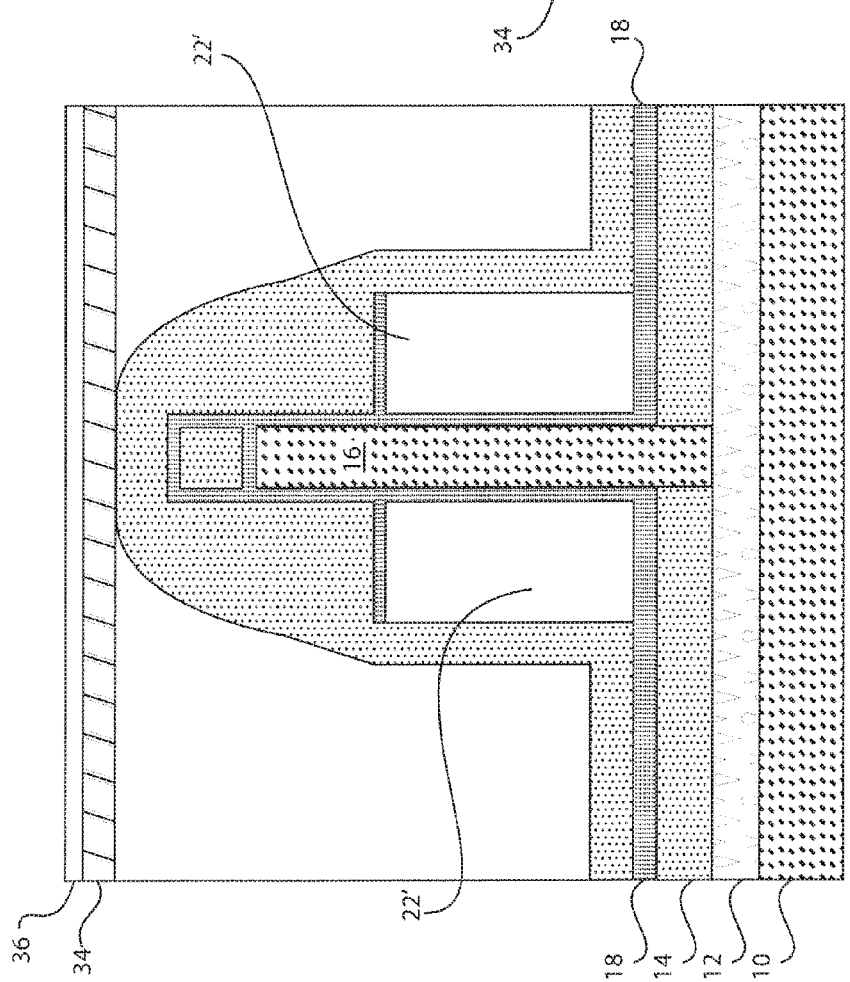
FIG. 20
FIG. 19

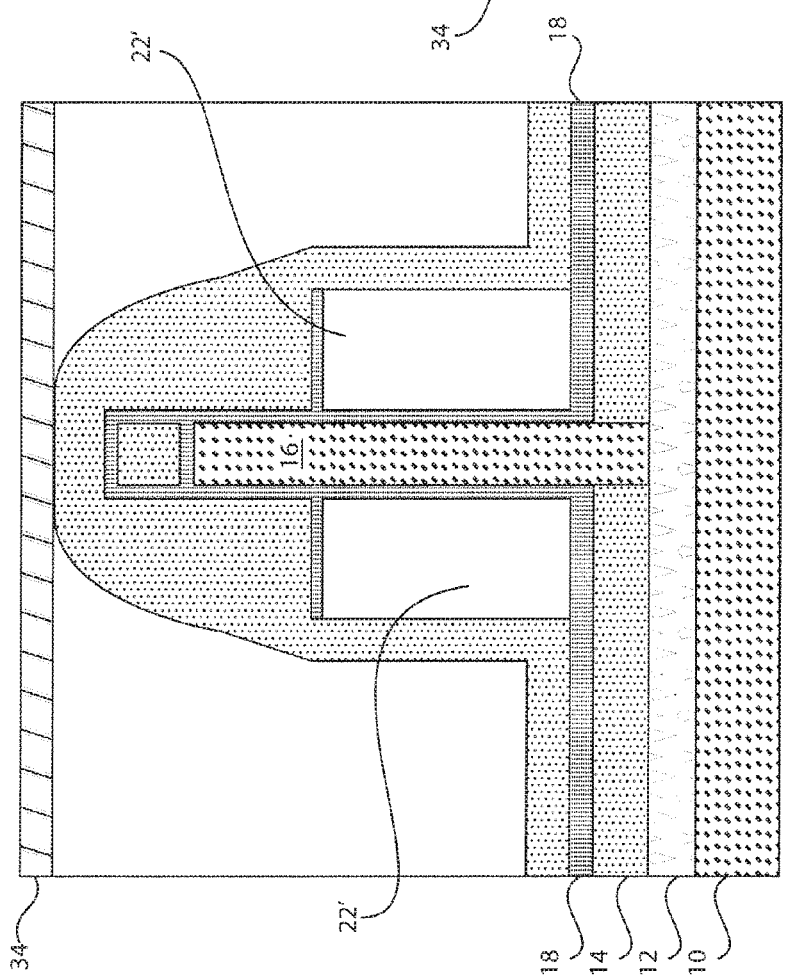
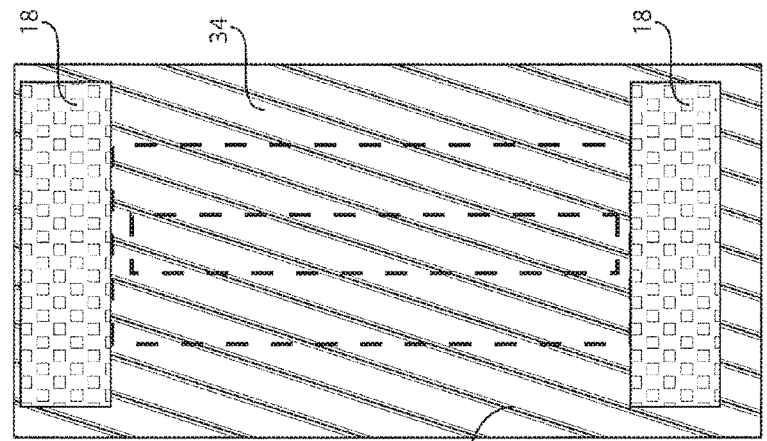
FIG. 21
FIG. 22

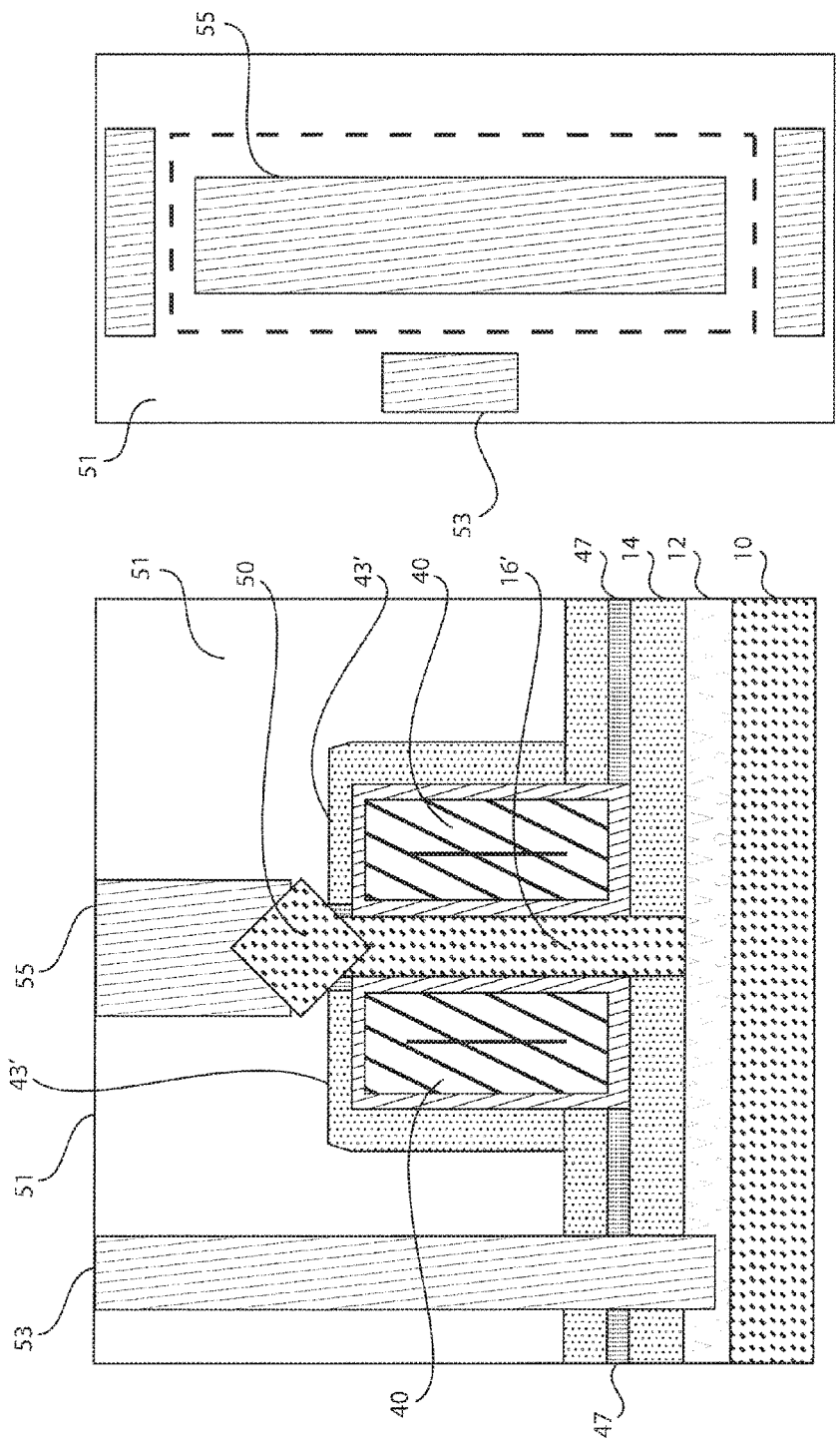

REPLACEMENT METAL GATE SCHEME WITH SELF-ALIGNMENT GATE FOR VERTICAL FIELD EFFECT TRANSISTORS

BACKGROUND

Technical Field

The present invention relates generally to semiconductor devices, and more specifically, to a self-alignment gate for a vertical field effect transistor (VFET).

Description of the Related Art

A fin metal-oxide-semiconductor field effect transistor (finMOSFET or FinFET) can provide solutions to metal-oxide-semiconductor field effect transistor (MOSFET) scaling issues at and below, for example, the 22 nanometer (nm) node of semiconductor technology. A FinFET includes at least one narrow semiconductor fin (e.g., less than 30 nm wide) gated on at least two opposing sides of each of the at least one semiconductor fin. FinFET structures can, for example, typically be formed on either a semiconductor-on-insulator (SOI) substrate or a bulk semiconductor substrate.

A feature of a FinFET is a gate electrode located on at least two sides of the channel formed along the longitudinal direction of the fin. Due to the feature of full depletion in the fin structure, the increased number of sides (e.g., two or three) on which the gate electrode controls the channel of the FinFET enhances the controllability of the channel in a FinFET compared to a planar MOSFET. The improved control of the channel, among other things, allows smaller device dimensions with less short channel effects as well as larger electrical current that can be switched at high speeds.

CMOS (complementary metal oxide semiconductor) processing requires both NMOS (n-type) and PMOS (p-type) devices. In these devices, high-k/metal gate implementation requires a metal that works for NMOS (typically of workfunction between 4.2 eV and 4.6 eV) and a metal that works for PMOS (typically of workfunction between 4.8 eV and 5.2 eV). This constitutes the material requirements of two "work function" metals (properties capable of achieving $V_t$), one needed for each device. The work function metals between 4.2 eV to 4.6 eV and 4.8 to 5.2 eV are needed to adjust the $V_t$ of the NMOS and PMOS devices, respectively.

In conventional processing of CMOS, a single metal is used in the gate fabrication of the NMOS and another single metal is used for the gate fabrication of the PMOS. Also, it is known that most metals with high work function have stable bulk characteristics after high thermal processing. However, these metals alter their interface characteristics with the high-k dielectric after high-temperature processing which manifests itself as $V_t$ variation and dielectric leakage. These conditions lead to decreased device reliability. Devices with work functions nearer to the silicon mid-gap energy require lower values of channel doping in order to achieve proper $V_t$. This leads to difficulties in controlling $V_t$ roll-off, that is, the rapid change in $V_t$ with variation in gate length, thereby leading to $V_t$ tolerance degradation, which is especially detrimental to analog circuits.

VFETs (vertical field effect transistors) provide the chance to further scale transistors. In one process flow in vertical transistors, the top region of a work function (WF) is exposed to reactive ion etching (RIE), air, wet etching, and encapsulation. Therefore, the work function for an nFET in this region is higher, and, thus, the voltage threshold (Vt) is also higher. As a result, the performance of the VFET is affected. Therefore, solving the impact of WF metal recess and the encapsulation on the top portion of the metal is desirable.

SUMMARY

In accordance with an embodiment, a method is provided for forming a semiconductor structure. The method includes forming a fin structure over a substrate, forming a dummy gate over the fin structure, and etching the dummy gate by a first amount to expose a top portion of the fin structure. The method further includes forming a first dielectric layer (oxide) adjacent the exposed top portion of the fin structure, forming a spacer adjacent the first dielectric layer contacting the fin structure, and etching the dummy gate by a second amount. The method further includes depositing a second dielectric layer (nitride) to encapsulate the remaining dummy gate, depositing an inter-level dielectric (ILD) over the second dielectric layer, depositing at least one hard mask to access the dummy gate, stripping the dummy gate to form at least one recess, and filling the at least one recess with a high-k metal gate (HKMG).

In accordance with another embodiment, a semiconductor device is provided. The semiconductor device includes a fin structure formed over a substrate, a dummy gate formed over the fin structure, the dummy gate etched by a first amount to expose a top portion of the fin structure, a first dielectric layer (oxide) formed adjacent the exposed top portion of the fin structure, a spacer formed adjacent the first dielectric layer contacting the fin structure, the dummy gate etched further by a second amount after spacer formation, a second dielectric layer (nitride) deposited to encapsulate the remaining dummy gate, an inter-level dielectric (ILD) formed over the second dielectric layer, at least one hard mask formed over the ILD to access the dummy gate, the dummy gate stripped to form at least one recess, and a high-k metal gate (HKMG) deposited within the at least one recess.

In one preferred aspect, the dummy gate is laterally etched.

In another preferred aspect, the HKMG directly contacts the fin structure.

In yet another preferred aspect, a nitride hard mask is formed over the top portion of the fin structure before forming the dummy gate over the fin structure.

In another preferred aspect, after formation of the HKMG, the dummy gate is etched by a third amount to remove the nitride hard mask formed over the top portion of the fin structure. The nitride is etched to expose the top portion of the fin structure.

In yet another preferred aspect, an epitaxial growth layer is formed directly over the top portion of the fin structure.

In another preferred aspect, after formation of the epitaxial growth layer, a gate contact, source contact, and a drain contact are formed.

In one aspect, stripping of the dummy gate results in removal of oxide adjacent the fin structure. The dummy gate can be stripped by, e.g., hot ammonia.

The advantages of the present invention include forming the replaceable metal gate (RMG) after the formation of the top source/drain regions. Additional advantages include maximizing effective device width (i.e., number of fins) to improve device performance (i.e., by having more active fins). Moreover, lateral etching results in less defects during manufacturing and manufacturing costs can be reduced by, e.g., simplifying cell connectivity schemes.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein:

FIG. 5 is a cross-sectional view of the semiconductor device of FIG. 3 where the dummy gate and oxide are selectively removed to expose a top portion of the fin structure, as well as the nitride hard mask positioned over the fin structure, in accordance with an embodiment of the present invention;

FIG. 6 is a top view of the semiconductor device of FIG. 5, in accordance with an embodiment of the present invention;

FIG. 7 is a cross-sectional view of the semiconductor device of FIG. 5 where an oxide layer is deposited over the top portion of the fin structure and the nitride hard mask, in accordance with an embodiment of the present invention;

FIG. 8 is a top view of the semiconductor device of FIG. 7, in accordance with an embodiment of the present invention;

FIG. 15 is a cross-sectional view of the semiconductor device of FIG. 13 where nitride deposition takes place to encapsulate the remaining dummy gate regions, in accordance with an embodiment of the present invention;

FIG. 16 is a top view of the semiconductor device of FIG. 15, in accordance with an embodiment of the present invention;

FIG. 19 is a cross-sectional view of the semiconductor device of FIG. 17, where at least one hard mask is formed, in accordance with an embodiment of the present invention;

FIG. 20 is a top view of the semiconductor device of FIG. 19, in accordance with an embodiment of the present invention;

FIG. 21 is a cross-sectional view of the semiconductor device of FIG. 19 where the dummy gate is opened, in accordance with an embodiment of the present invention;

FIG. 22 is a top view of the semiconductor device of FIG. 21, in accordance with an embodiment of the present invention;

FIG. 41 is a cross-sectional view of the semiconductor device of FIG. 39 where source, drain, and gate contacts are formed, in accordance with an embodiment of the present invention;

FIG. 42 is a top view of the semiconductor device of FIG. 41, in accordance with an embodiment of the present invention.

Throughout the drawings, same or similar reference numerals represent the same or similar elements.

DETAILED DESCRIPTION

Figure 2:
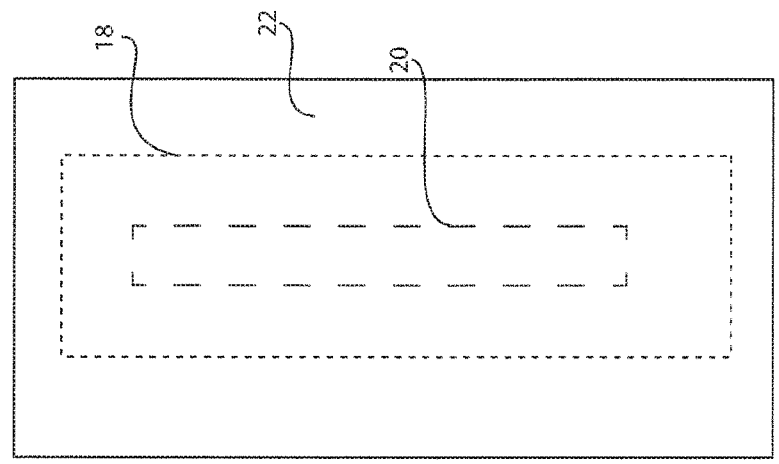
FIG. 2 is a top view of the semiconductor structure of FIG. 1, in accordance with an embodiment of the present invention.

In one or more embodiments, a method advantageously includes forming a fin structure over a substrate, forming a dummy gate over the fin structure, and etching the dummy gate by a first amount to expose a top portion of the fin structure. The method further includes forming an oxide layer adjacent the exposed top portion of the fin structure, forming a spacer adjacent the oxide layer contacting the fin structure, and etching the dummy gate by a second amount. The method further includes depositing nitride to encapsulate the remaining dummy gate, depositing an inter-level dielectric (ILD) over the nitride, depositing at least one hard mask to access the dummy gate, stripping the dummy gate to form at least one recess, and filling the at least one recess with a high-k metal gate (HKMG).

In one or more embodiments, a semiconductor structure advantageously includes a fin structure formed over a substrate, a dummy gate formed over the fin structure, the dummy gate etched by a first amount to expose a top portion of the fin structure, an oxide layer formed adjacent the exposed top portion of the fin structure, a spacer formed adjacent the oxide layer contacting the fin structure, the dummy gate etched further by a second amount after spacer formation, nitride deposition to encapsulate the remaining dummy gate, an inter-level dielectric (ILD) formed over the nitride, at least one hard mask formed over the ILD to access the dummy gate, the dummy gate stripped to form at least one recess, and a high-k metal gate (HKMG) deposited within the at least one recess.

In one or more embodiments, VTFETs provide the chance to further scale transistors. In current go-to process flow in vertical transistors, the top region of a work function (WF) is exposed to reactive ion etching (RIE), air, wet etching, and encapsulation. Therefore, the work function for an nFET in this region is higher, and, thus, the voltage threshold (Vt) is also higher. As a result, the performance of the VFET is affected. Therefore, solving the impact of WF metal recess and the encapsulation on the top portion of the metal is desirable.

The work function is the minimum energy (usually measured in electron volts) needed to remove an electron from a solid to a point immediately outside the solid surface (or energy needed to move an electron from the Fermi energy level into vacuum). Here "immediately" means that the final electron position is far from the surface on the atomic scale but still close to the solid on the macroscopic scale. The work function is an important property of metals. The magnitude of the work function is usually about a half of the ionization energy of a free atom of the metal. The threshold voltage of a MOSFET is usually defined as the gate voltage where an inversion layer forms at the interface between the insulating layer (oxide) and the substrate (body) of the transistor.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE). Other examples of anisotropic etching that can be used include ion beam etching, plasma etching or laser ablation.

As used herein, the term "fin structure" refers to a semiconductor material, which can be employed as the body of a semiconductor device, in which a gate structure is positioned around the fin structure such that charge flows down the channel on the two sidewalls of the fin structure and optionally along the top surface of the fin structure. The fin structures are processed to provide FinFETs. A field effect transistor (FET) is a semiconductor device in which output current, i.e., source-drain current, is controlled by the voltage applied to the gate structure to the channel of a semiconductor device. A finFET is a semiconductor device that positions the channel region of the semiconductor device in a fin structure.

The term "processing" as used herein includes deposition of material or photoresist, patterning, exposure, development, etching, cleaning, stripping, implanting, doping, stressing, layering, and/or removal of the material or photoresist as required in forming a described structure.

Exemplary types of semiconductor devices include planar field effect transistors (FETs), fin-type field effect transistors (FinFETs), nanowire/nanosheet devices, vertical field effect transistors (VFETs), or other devices.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1:
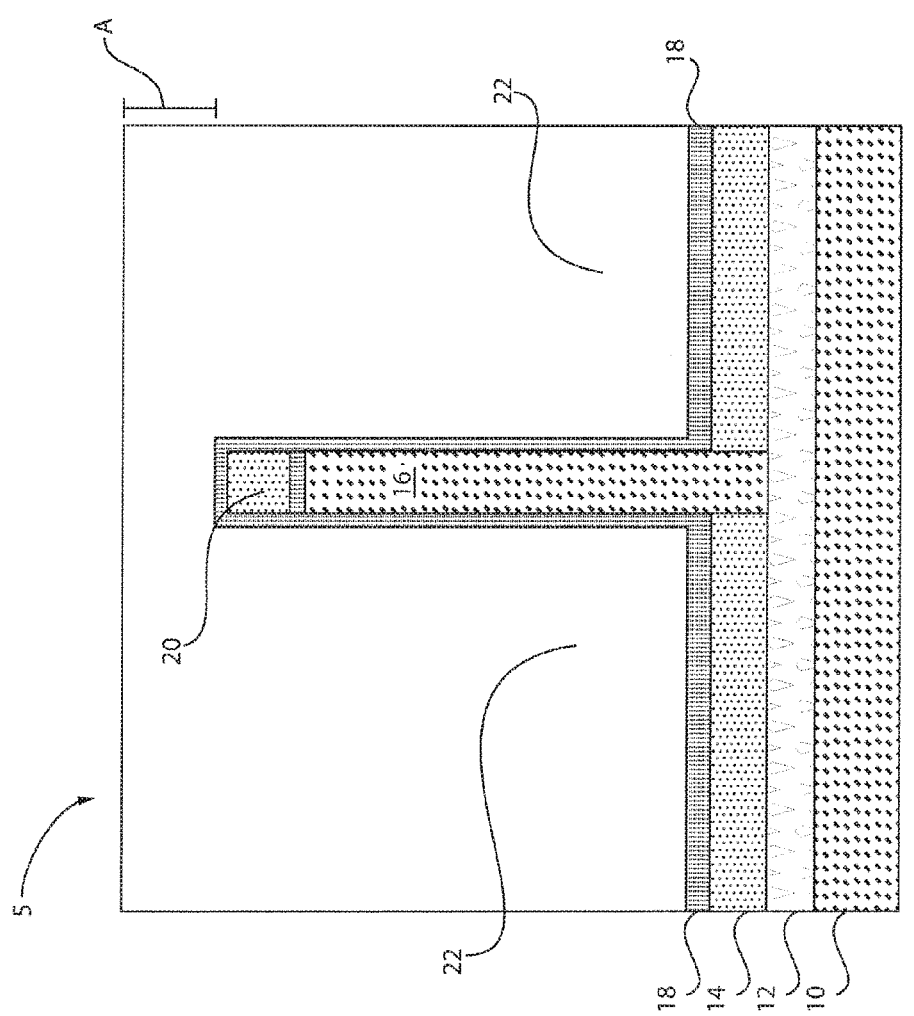
FIG. 1 is a cross-sectional view of a semiconductor structure including a fin structure over a substrate with bottom spacer and bottom junction, the fin coated with an oxide layer and encapsulated by a dummy gate, in accordance with an embodiment of the present invention.

FIG. 1 is a cross-sectional view of a semiconductor structure including a fin structure over a substrate with bottom spacer and bottom junction, the fin coated with an oxide layer and encapsulated by a dummy gate, in accordance with an embodiment of the present invention.

A semiconductor structure 5 includes a semiconductor substrate 10 with a fin structure 16 positioned thereon. The bottom junction 12 is deposited over the substrate 10. The bottom junction 12 can be, e.g., SiO$_2$ (silicon dioxide). An isolation layer (bottom spacer) 14 can be deposited over the bottom junction 12. In one embodiment, a proximal portion of the fin 16 extends into the isolation dielectric layer 14. The fin 16 extend vertically from the substrate 10. Stated differently, the fin 16 is normal to or perpendicular to the substrate 10.

A sacrificial oxide layer 18 is deposited over the fin 16, as well as over the isolation dielectric layer 14. The oxide layer 18 encompasses or envelops the fin 16. Additionally, a nitride hard mask 20 can be deposited or formed over the fin 16. The nitride hard mask 20 is also enveloped by the oxide layer 18. The nitride hard mask 20 is aligned with the fin structure 16. A dummy gate 22 is then deposited over the fin 16 and the nitride hard mask 20. The dummy gate 22 extends a distance "A" over the top portion of the nitride hard mask 20. In one example embodiment, the thickness of the hard mark 20 can be approximately equal to the thickness of the fin 16.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, Al$_2$O$_3$, SiO$_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

As used herein, a "semiconductor fin" refers to a semiconductor structure including a portion having a shape of a rectangular parallelepiped. The direction along which a semiconductor fin 16 laterally extends the most is herein referred to as a "lengthwise direction" of the semiconductor fin 16. The height of each semiconductor fin 16 can be in a range from 5 nm to 300 nm, although lesser and greater heights can also be employed. The width of each semiconductor fin 16 can be in a range from 5 nm to 100 nm, although lesser and greater widths can also be employed. In various embodiments, the fins 16 can have a width in the range of about 6 nm to about 20 nm, or can have a width in the range of about 8 nm to about 15 nm, or in the range of about 10 nm to about 12 nm. In various embodiments, the fin 16 can have a height in the range of about 25 nm to about 75 nm, or in the range of about 40 nm to about 50 nm.

Multiple semiconductor fins 16 can be arranged such that the multiple semiconductor fins 16 have the same lengthwise direction, and are laterally spaced from each other along a horizontal direction that is perpendicular to the lengthwise direction. In this case, the horizontal direction that is perpendicular to the common lengthwise direction is referred to as a "widthwise direction." Each semiconductor fin 16 includes a pair of parallel sidewalls along the lengthwise direction.

In one embodiment, each semiconductor fin 16 can be formed by lithography and etching. The lithographic step can include forming a photoresist (not shown) atop a substrate including a topmost semiconductor material, exposing the photoresist to a desired pattern of radiation and then developing the exposed photoresist utilizing a conventional resist developer. The pattern within the photoresist is then transferred into the topmost semiconductor material. The etch can include a dry etch process, a chemical wet etch process, or any combination thereof. When a dry etch is used, the dry etch can be a reactive ion etch process, a plasma etch process, ion beam etching or laser ablation. The patterned photoresist material can be removed after transferring the pattern utilizing a conventional stripping process.

In another embodiment of the present application, each semiconductor fin 16 can be formed utilizing a SIT (sidewall image transfer) process. In a typical SIT process, spacers are formed on sidewall surfaces of a sacrificial mandrel that is formed on a topmost semiconductor material of a substrate. The sacrificial mandrel is removed and the remaining spacers are used as a hard mask to etch the topmost semiconductor material of the substrate. The spacers are then removed after each semiconductor fin 16 has been formed. In another embodiment, sequential SIT processes can be utilized to form fins with highly scaled fin width and pitches.

In some embodiments, the fins 16 in the plurality of semiconductor fins can have a fin width between 5 nm and 10 nm. The combination of the fin width and the width of the trough equals, in embodiments, the fin pitch. The fin width and the fin pitch can vary in different areas of a fin array, and can vary from one fin array to another on a semiconductor wafer, according to the design parameters of the integrated circuit that is being made. For example, fins of negatively doped FinFETs can have a different fin size than positively doped FinFETs because of the electrical properties of the materials they are made of.

In various embodiments, the oxide layer 18 can be silicon oxide (e.g., SiO$_2$) which can be formed by chemical vapor deposition (CVD), ALD, or a combination thereof, or other dielectric materials as long as the material have a better selective etch to the bottom spacer. The silicon oxide of the bilayer can be directly on the vertical sides of the fins 16. In various embodiments, the portion of the oxide layer 18 can be removed by chemical-mechanical polishing (CMP) and/or etching.

FIG. 2 is a top view of the semiconductor structure of FIG. 1, in accordance with an embodiment of the present invention.

The top view depicts the dummy gate 22 encapsulating the entire device 5.

Figure 3:
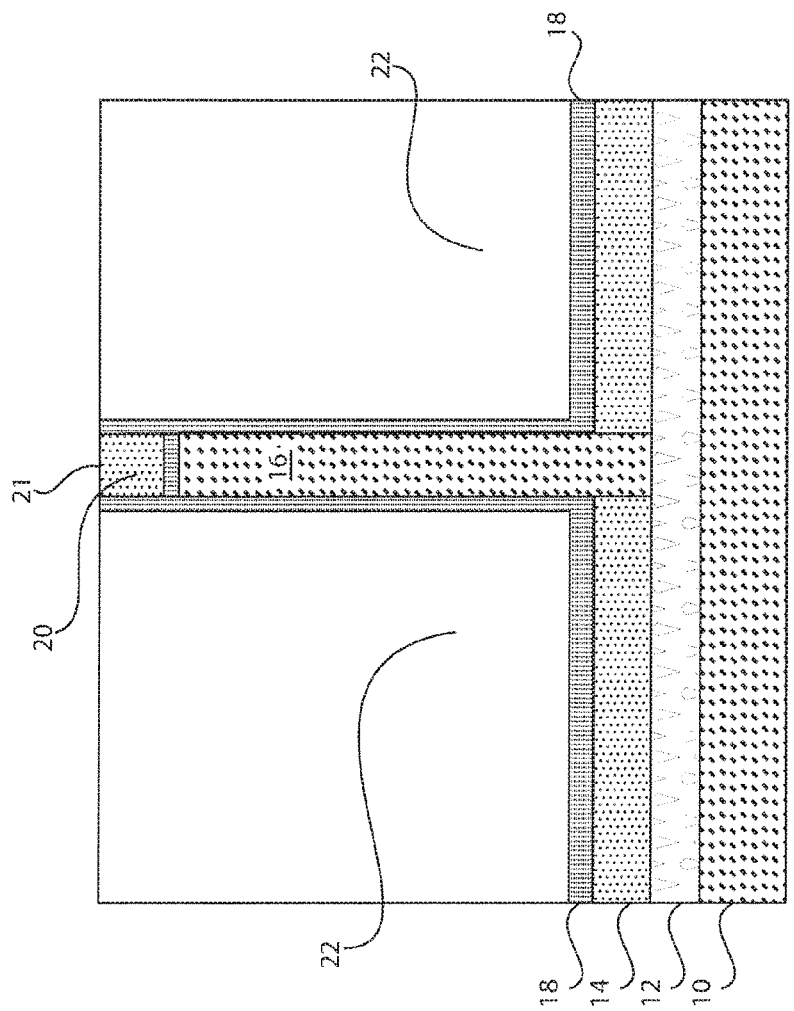
FIG. 3 is a cross-sectional view of the semiconductor structure of FIG. 1 where the dummy gate is partially etched to expose a nitride hard mask positioned over the fin structure, in accordance with an embodiment of the present invention.

FIG. 3 is a cross-sectional view of the semiconductor structure of FIG. 1 where the dummy gate is partially etched to expose a nitride hard mask positioned over the fin structure, in accordance with an embodiment of the present invention.

In various embodiments, the dummy gate 22 and a portion of the oxide 18 are etched. The oxide 18 is etched such that a top surface 21 of the nitride hard mask 20 is exposed. The dummy gate 22 can be, e.g., amorphous Si, tungsten, TiN. The dummy gate 22 covers the fin 16 (having the oxide layer 18) and also covers the nitride hard mask 20. The dummy gate 22 is planarized (via, e.g., CMP) and etched back to be removed. The dummy gate 22 has a thickness that is greater than the thickness of the fin 16. The dummy gate 22 can also have a thickness that is greater than the thickness of the nitride hard mask 20.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. The patterned photoresist can be removed utilizing an ashing process.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

Figure 4:
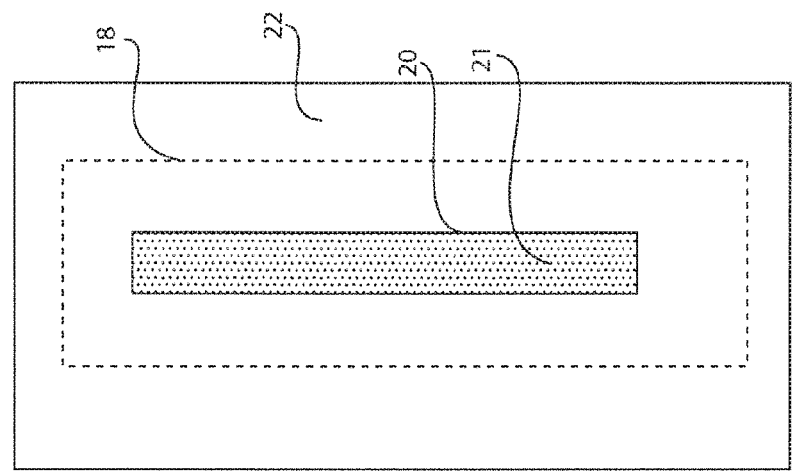
FIG. 4 is a top view of the semiconductor structure of FIG. 3, in accordance with an embodiment of the present invention.

FIG. 4 is a top view of the semiconductor structure of FIG. 3, in accordance with an embodiment of the present invention.

The top view depicts the top surface 21 of the nitride hard mask 20 being exposed after etching of a portion of the dummy gate 22.

FIG. 5 is a cross-sectional view of the semiconductor device of FIG. 3 where the dummy gate and oxide are selectively removed to expose a top portion of the fin structure, as well as the nitride hard mask positioned over the fin structure, in accordance with an embodiment of the present invention.

In various embodiments, the dummy gate 22 is further etched. The dummy gate etching further results in exposing a top portion 17 of the fin 16. A subsequent post RIE wet clean (e.g., dilute hydrogen fluoride (HF)) results in the selective removal of the oxide layer 18 from the exposed portion 17 of the fin 16, as well as from the nitride hard mask 20. Thus, the protective layer around the fin 16 can be removed by etching or by WETs (e.g. dilute HF for $SiO_2$). An oxide layer 18 is still present between the nitride hard mask 20 and the top portion 17 of the fin 16. Thus, the fin 16 and the nitride hard mask 20 remain separated throughout the process. The top portion 17 of the fin 16 can extend a distance "X" from the remaining dummy gate 22.

RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

FIG. 6 is a top view of the semiconductor device of FIG. 5, in accordance with an embodiment of the present invention.

The top view still depicts the top surface 21 of the nitride hard mask 20 after etching of a portion of the dummy gate 22.

FIG. 7 is a cross-sectional view of the semiconductor device of FIG. 5 where an oxide layer is deposited over the top portion of the fin structure and the nitride hard mask, in accordance with an embodiment of the present invention.

In various embodiments, an oxide layer 24 is deposited over the dummy gate 22, over the nitride hard mark 20, and adjacent the top portion 17 of the fin 16. Thus, the nitride hard mask 20 and the exposed fin structure 17 are encapsulated by oxide layer 24.

FIG. 8 is a top view of the semiconductor device of FIG. 7, in accordance with an embodiment of the present invention.

The top view depicts the structure being encapsulated by the oxide layer 24.

Figure 9:
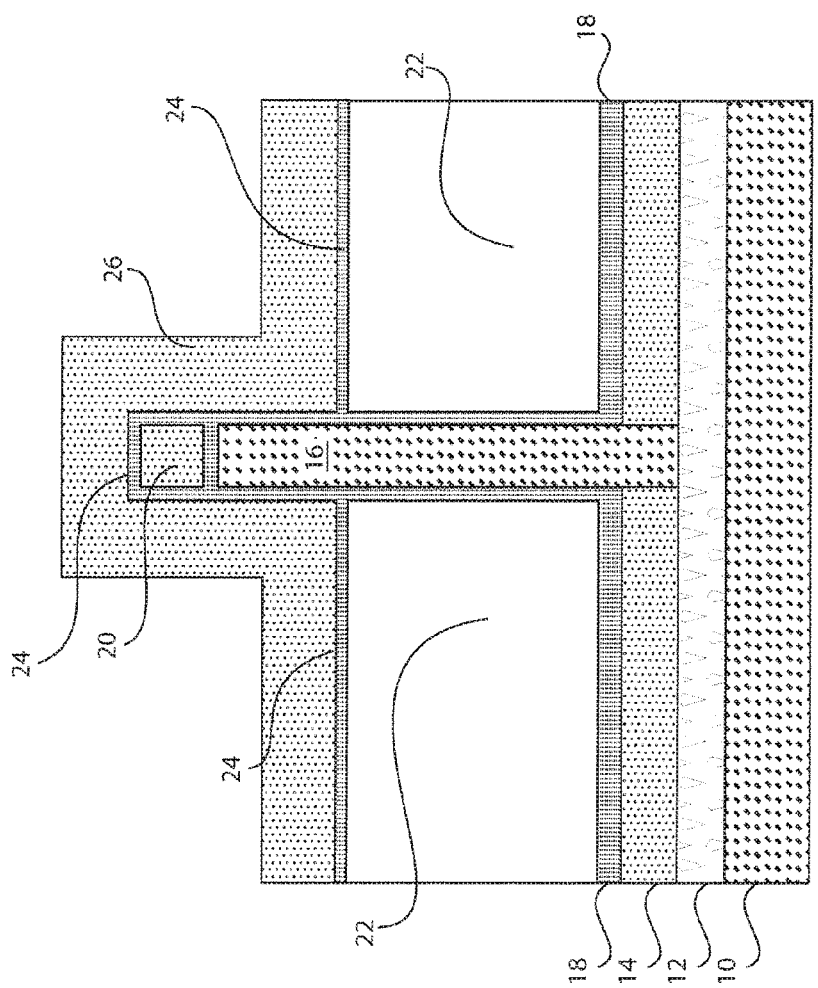
FIG. 9 is a cross-sectional view of the semiconductor device of FIG. 7 where nitride deposition takes place, in accordance with an embodiment of the present invention.

FIG. 9 is a cross-sectional view of the semiconductor device of FIG. 7 where nitride deposition takes place, in accordance with an embodiment of the present invention.

In various embodiments, a nitride layer 26 is deposited over the oxide layer 24. The nitride layer 26 aids in the formation of a spacer, as described below.

Figure 10:
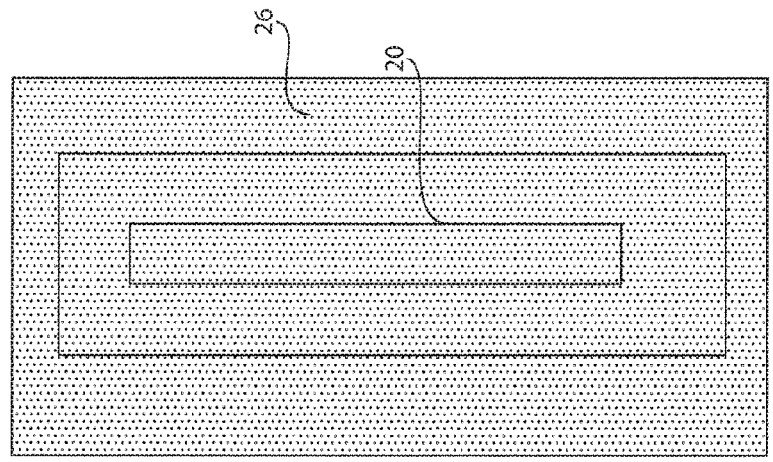
FIG. 10 is a top view of the semiconductor device of FIG. 9, in accordance with an embodiment of the present invention.

FIG. 10 is a top view of the semiconductor device of FIG. 9, in accordance with an embodiment of the present invention.

The top view depicts the structure being encapsulated by the nitride layer 26.

Figure 11:
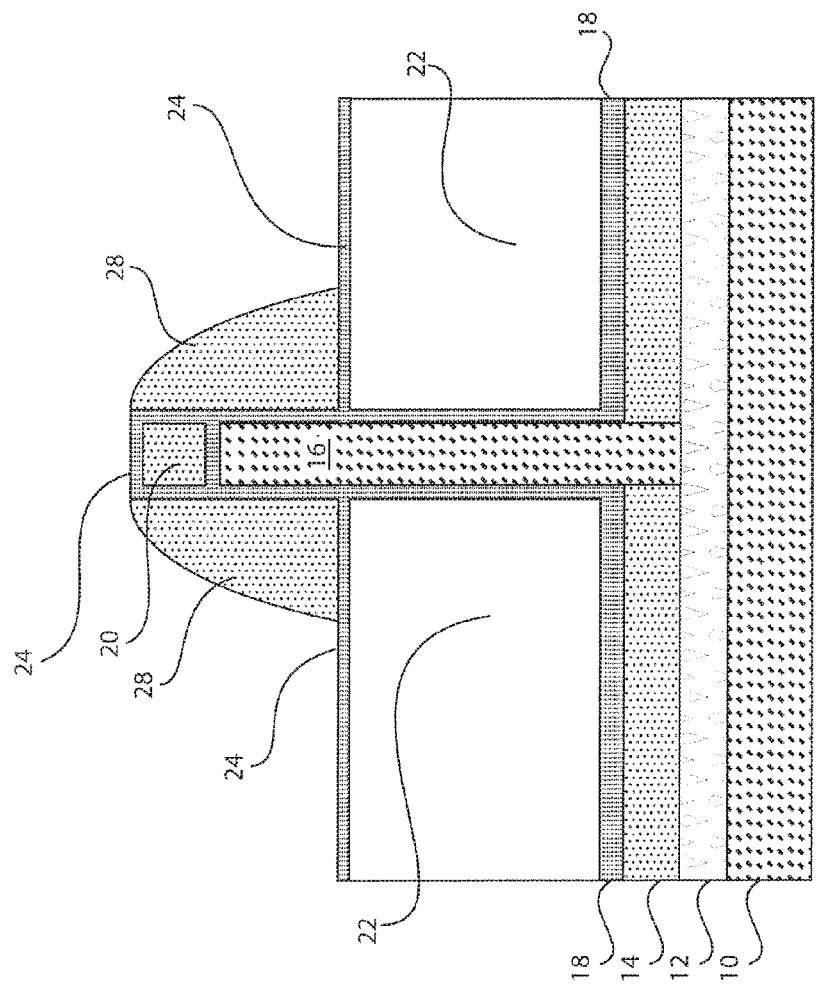
FIG. 11 is a cross-sectional view of the semiconductor device of FIG. 9 where a spacer hard mask is formed, in accordance with an embodiment of the present invention.

FIG. 11 is a cross-sectional view of the semiconductor device of FIG. 9 where a spacer hard mask is formed, in accordance with an embodiment of the present invention.

In various embodiments, spacers 28 are formed by, e.g., an RIE etch. The spacers 28 can be, e.g., a nitride film (i.e., nitride layer 26). In an embodiment, the spacer 28 can be a nitride, for example, a silicon nitride (SiN), or an oxynitride, for example, silicon oxynitride (SiON). In an embodiment, the spacer 28 can be, e.g., SiOCN, SiBCN, or similar film types, as long as it is has good selective to the oxide. The spacer 28 can also be referred to as a non-conducting dielectric layer.

In some exemplary embodiments, the spacer 28 can include a material that is resistant to some etching processes such as, for example, HF chemical etching or chemical oxide removal etching.

In one or more embodiments, the spacer 28 can have a thickness in the range of about 3 nm to about 10 nm, or in the range of about 3 nm to about 5 nm.

The spacers 28 extend to a top portion of the oxide layer 24 formed over the nitride hard mask 20. In other words, the top surface of the spacers 28 are flush with the oxide layer 24. The spacers 28 have a thickness that is less than a thickness of the dummy gate 22. The spacers 28 have a thickness that is greater than the thickness of the fin 16 and greater than the thickness of the nitride hard mask 20.

Figure 12:
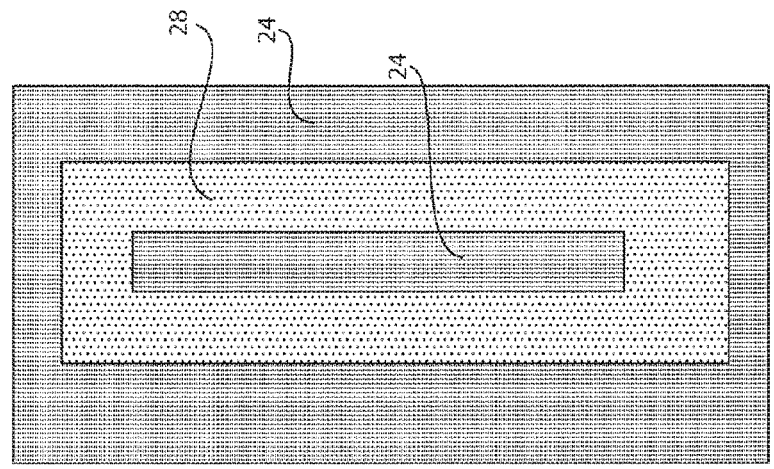
FIG. 12 is a top view of the semiconductor device of FIG. 11, in accordance with an embodiment of the present invention.

FIG. 12 is a top view of the semiconductor device of FIG. 11, in accordance with an embodiment of the present invention.

The top view depicts the spacers 28 surrounding the oxide layer 24.

Figure 13:
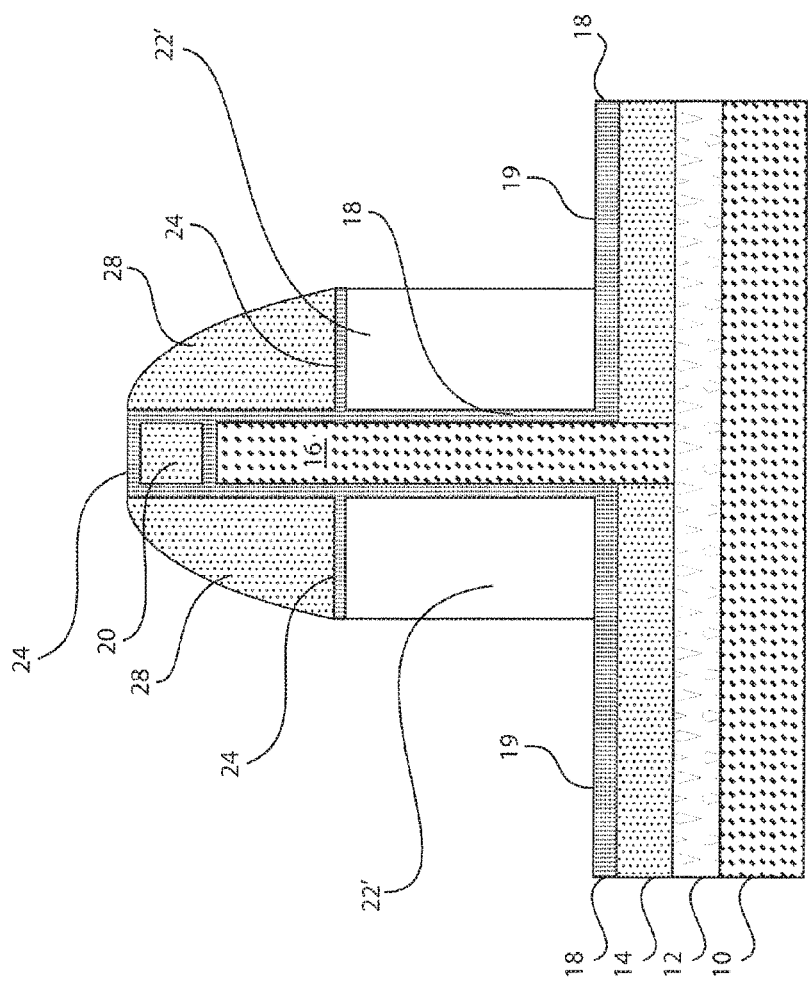
FIG. 13 is a cross-sectional view of the semiconductor device of FIG. 11 where the dummy gate is further etched to form remaining dummy gate regions underneath the spacer hard mask, in accordance with an embodiment of the present invention.

FIG. 13 is a cross-sectional view of the semiconductor device of FIG. 11 where the dummy gate is further etched to form remaining dummy gate regions underneath the spacer hard mask, in accordance with an embodiment of the present invention.

In various embodiments, the dummy gate 22 is further etched back to form dummy gate regions 22' underneath the spacers 28. In other words, the spacers 28 are advantageously aligned with the dummy gate regions 22'. The dummy gate regions 22' are formed adjacent the fin 16. Etching of the dummy gate 22 also results in the exposure of the top surface 19 of the oxide layer 18.

Figure 14:
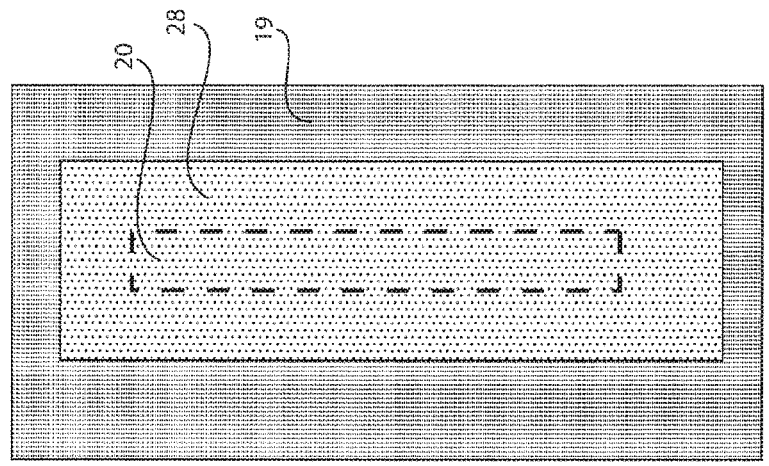
FIG. 14 is a top view of the semiconductor device of FIG. 13, in accordance with an embodiment of the present invention.

FIG. 14 is a top view of the semiconductor device of FIG. 13, in accordance with an embodiment of the present invention.

The top view depicts the spacers 28 and the top surface 19 of the oxide layer 18.

FIG. 15 is a cross-sectional view of the semiconductor device of FIG. 13 where nitride deposition takes place to encapsulate the remaining dummy gate regions, in accordance with an embodiment of the present invention.

In various embodiments, a nitride layer 30 is deposited over the structure such that that nitride layer 30 encapsulates the spacers 28 and the dummy gate regions 22'. The nitride layer 30 can extend a distance "B" over the nitride hard mask 20. The nitride layer 30 also covers the top portion 19 of the oxide layer 18 formed over the isolation dielectric layer 14. In one embodiment, the layer 30 could be different from the layer 28.

FIG. 16 is a top view of the semiconductor device of FIG. 15, in accordance with an embodiment of the present invention.

The top view depicts the nitride layer 30 encapsulating the entire structure.

Figure 17:
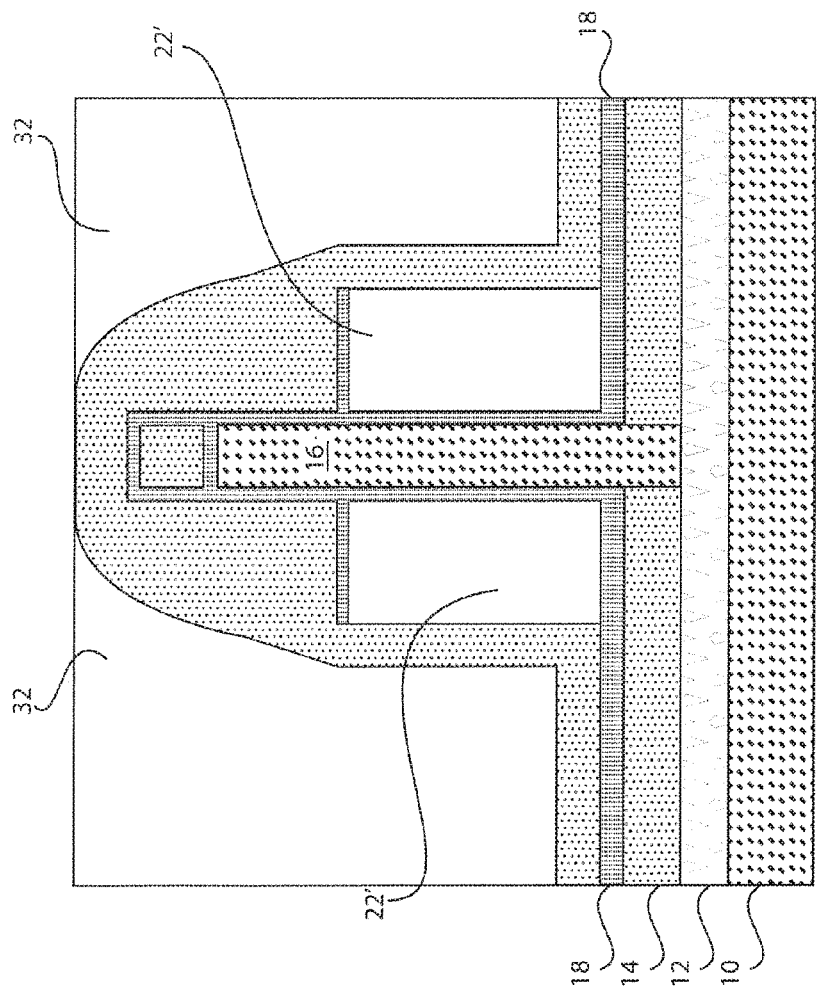
FIG. 17 is a cross-sectional view of the semiconductor device of FIG. 15 where an oxide gap fill takes place, in accordance with an embodiment of the present invention.

FIG. 17 is a cross-sectional view of the semiconductor device of FIG. 15 where an oxide gap fill takes place, in accordance with an embodiment of the present invention.

In various embodiments, an oxide gap fill takes place. The ILD oxide 32 is planarized. The ILD oxide 32 fills the remaining gap or recess between the fins 16. The ILD oxide 32 extends beyond a top surface of the fins 16. The ILD oxide 32 extends up to a top surface of the nitride layer 30. In other words, the ILD oxide 32 can be flush with the nitride layer 30.

In various embodiments, the height of the ILD oxide fill 32 can be reduced by chemical-mechanical polishing (CMP) and/or etching. Therefore, the planarization process can be provided by CMP. Other planarization process can include grinding and polishing.

In one or more embodiments, the ILD oxide 32 needs to have a thickness in the range of about 3 nm to about 100 nm, or in the range of about 30 nm to about 50 nm.

The ILD 32 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the ILD 32 include any of the aforementioned materials in porous form, or in a form that changes during processing to or from being porous and/or permeable to being non-porous and/or non-permeable. In one embodiment, the ILD layer can be bilayer.

Figure 18:
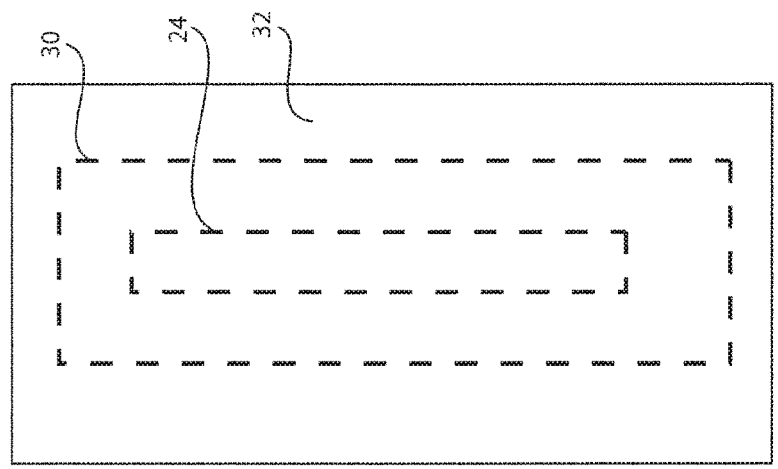
FIG. 18 is a top view of the semiconductor device of FIG. 17, in accordance with an embodiment of the present invention.

FIG. 18 is a top view of the semiconductor device of FIG. 17, in accordance with an embodiment of the present invention.

The top view depicts the ILD oxide 32 encapsulating the structure, as well as the top portion or surface of the nitride layer 30.

FIG. 19 is a cross-sectional view of the semiconductor device of FIG. 17, where at least one hard mask is formed, in accordance with an embodiment of the present invention.

In various embodiments, at least one hard mask is deposited over the structure. For example, a first hard mask 34 and a second hard mask 36 are deposited over the structure.

The block masks can comprise soft and/or hard mask materials and can be formed using deposition, photolithography and etching. In one embodiment, the block mask comprises a photoresist. A photoresist block mask can be produced by applying a photoresist layer, exposing the photoresist layer to a pattern of radiation, and then developing the pattern into the photoresist layer utilizing conventional resist developer. Typically, the block masks have a thickness ranging from 100 nm to 300 nm.

The block mask can comprise soft and/or hard mask materials and can be formed using deposition, photolithography and etching. In one embodiment, the block mask is a hard mask composed of a nitride-containing material, such as silicon nitride. It is noted that it is not intended that the block mask be limited to only silicon nitride, as the composition of the hard mask can include any dielectric material that can be deposited by chemical vapor deposition (CVD) and related methods. Other hard mask compositions for the block mask can include silicon oxides, silicon oxynitrides, silicon carbides, silicon carbonitrides, etc. Spin-on dielectrics can also be utilized as a hard mask material including, but not limited to: silsequioxanes, siloxanes, and boron phosphate silicate glass (BPSG).

In one embodiment, a block mask comprising a hard mask material can be formed by blanket depositing a layer of hard mask material, providing a patterned photoresist atop the layer of hard mask material, and then etching the layer of hard mask material to provide a block mask protecting at least one portion of the dummy gate 22. A patterned photoresist can be produced by applying a blanket photoresist layer to the surface of the dummy gate 22, exposing the photoresist layer to a pattern of radiation, and then developing the pattern into the photoresist layer utilizing resist developer. Etching of the exposed portion of the block mask can include an etch chemistry for removing the exposed portion of the hard mask material and having a high selectivity to at least the block mask. In one embodiment, the etch process can be an anisotropic etch process, such as reactive ion etch (RIE). In another embodiment, the replacement gate can be formed by utilizing the SIT patterning and etching process described above.

FIG. 20 is a top view of the semiconductor device of FIG. 19, in accordance with an embodiment of the present invention.

The top view depicts the dummy gate regions 22' opened by the hard mask deposition described above. The hard mask 36 is also visible in the top view.

FIG. 21 is a cross-sectional view of the semiconductor device of FIG. 19 where the dummy gate is opened, in accordance with an embodiment of the present invention.

In various embodiments, the hard mask 36 is removed and the hard mask 34 is now exposed in order to advantageously open the dummy gate regions 22'.

FIG. 22 is a top view of the semiconductor device of FIG. 21, in accordance with an embodiment of the present invention.

The top view depicts the oxide layer 18 being exposed after opening the dummy gate regions 22'. The top view also depicts the hard mask 34.

Figure 23:
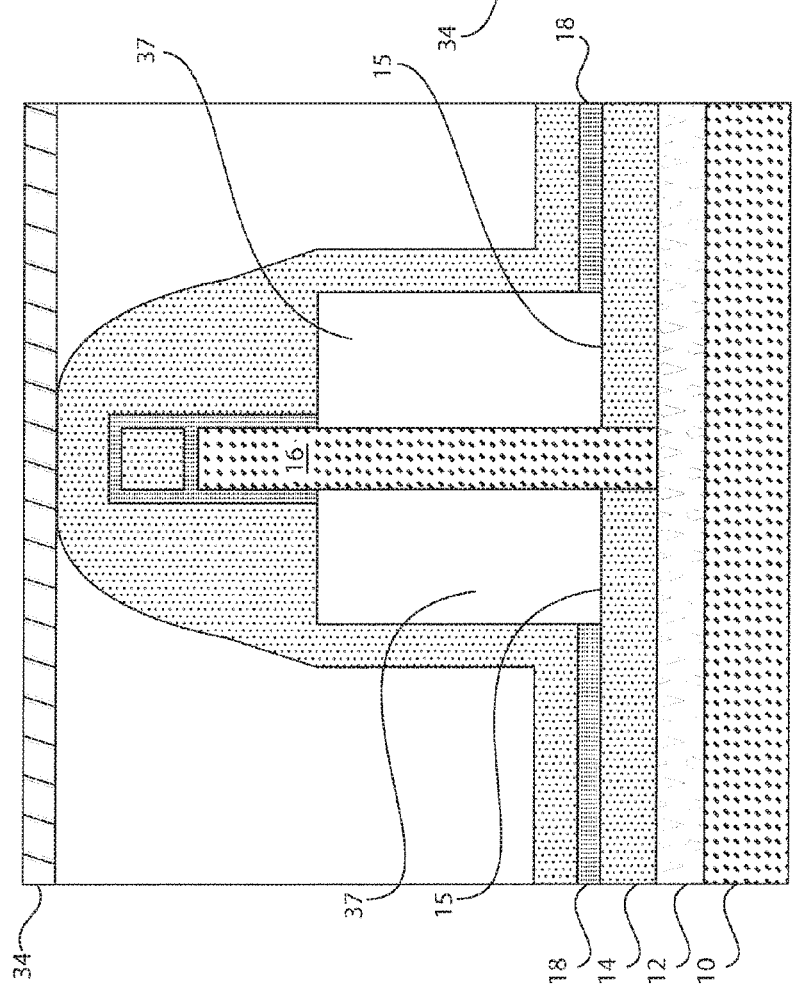
FIG. 23 is a cross-sectional view of the semiconductor device of FIG. 21 where the oxide is stripped to create recesses adjacent the fin structure, in accordance with an embodiment of the present invention.

FIG. 23 is a cross-sectional view of the semiconductor device of FIG. 21 where the oxide is stripped to advantageously create recesses adjacent the fin structure, in accordance with an embodiment of the present invention.

In various embodiments, the dummy gate regions 22' are stripped, thus advantageously creating recesses 37 adjacent the fin 16. Additionally, the oxide layer 18 is removed adjacent the fin 16. Oxide layer 18 still remains between the dielectric isolation layer 14 and the nitride layer 30. Therefore, the recesses 37 are formed between fin 16 and the nitride layer 30.

Figure 24:
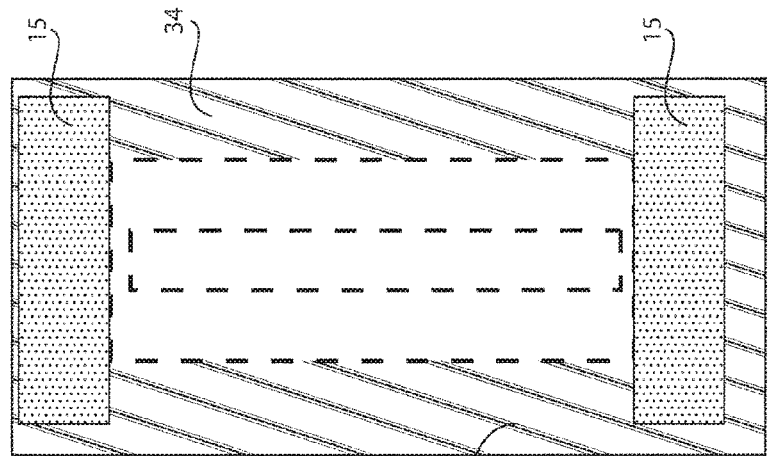
FIG. 24 is a top view of the semiconductor device of FIG. 23, in accordance with an embodiment of the present invention.

FIG. 24 is a top view of the semiconductor device of FIG. 23, in accordance with an embodiment of the present invention.

The top view depicts the top surface 15 of the isolation layer 14 that are now visible due to the removals of the dummy gate regions 22'. Additionally, the hard mask 34 is still visible.

Figure 25:
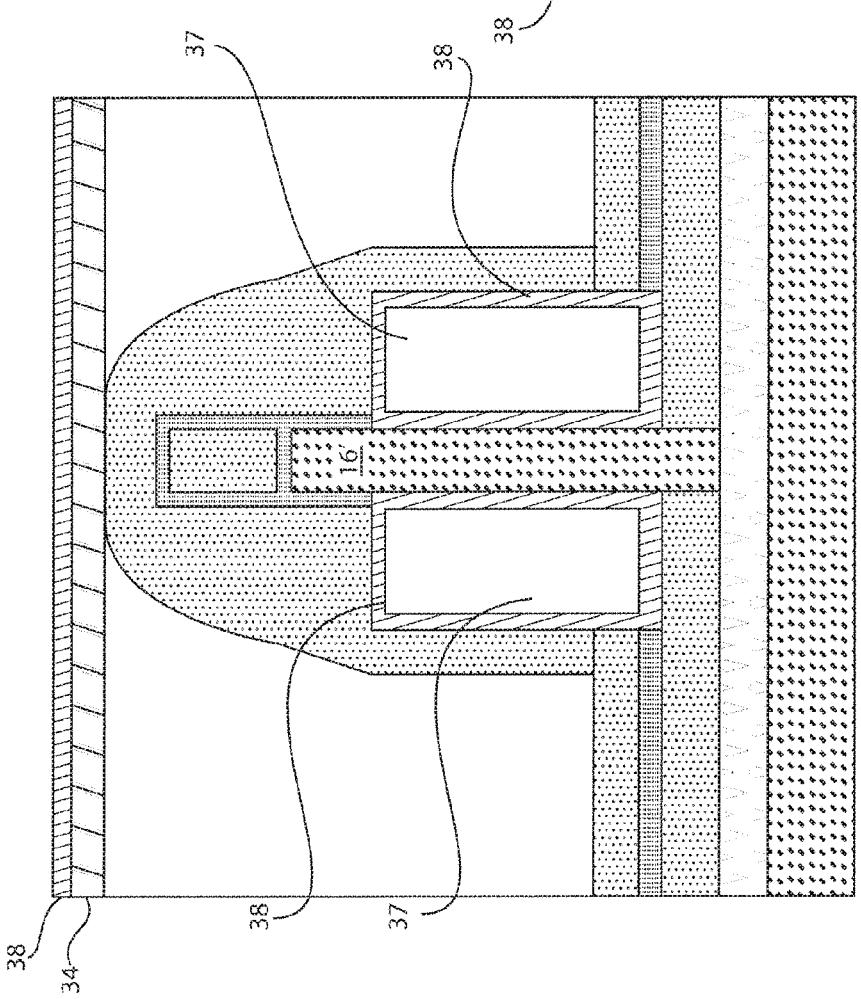
FIG. 25 is a cross-sectional view of the semiconductor device of FIG. 23 where a high-k dielectric is deposited within the recesses adjacent the fin structure, in accordance with an embodiment of the present invention.

FIG. 25 is a cross-sectional view of the semiconductor device of FIG. 23 where a high-k dielectric is deposited within the recesses adjacent the fin structure, in accordance with an embodiment of the present invention.

In various embodiments, it is useful to deposit a high-k dielectric 38. The high-k dielectric 38 contacts the fin 16'. The high-k dielectric 38 also encompasses the recesses 37 formed by the stripping of the dummy gate regions 22'. The high-k dielectric 38 is further formed over the hard mask 34.

Moreover, the fin 16 extends up to a top surface 11 of the isolation layer 14, thus forming fin 16'. Fin 16' is shorter in length than the fin 16.

The high-k dielectric 38 can include but is not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3} Nb_{2/3} O_3$). The high-k material can further include dopants such as lanthanum and/or aluminum. The stoichiometry of the high-K compounds can vary.

Figure 26:
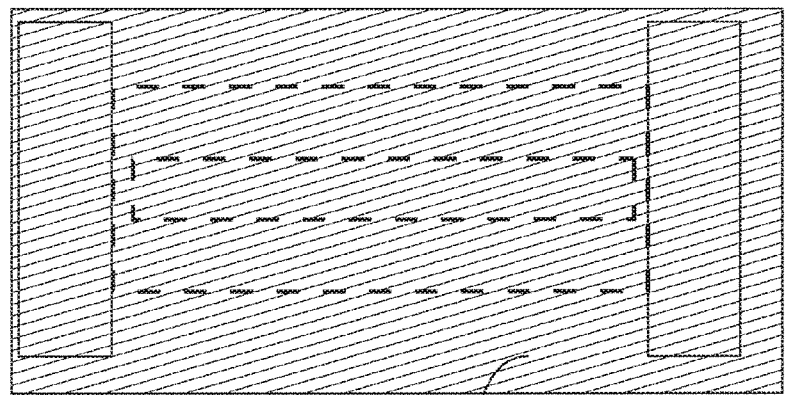
FIG. 26 is a top view of the semiconductor device of FIG. 25, in accordance with an embodiment of the present invention.

FIG. 26 is a top view of the semiconductor device of FIG. 25, in accordance with an embodiment of the present invention.

The top view depicts the high-k dielectric 38 encapsulating the device.

Figures 27, 28:
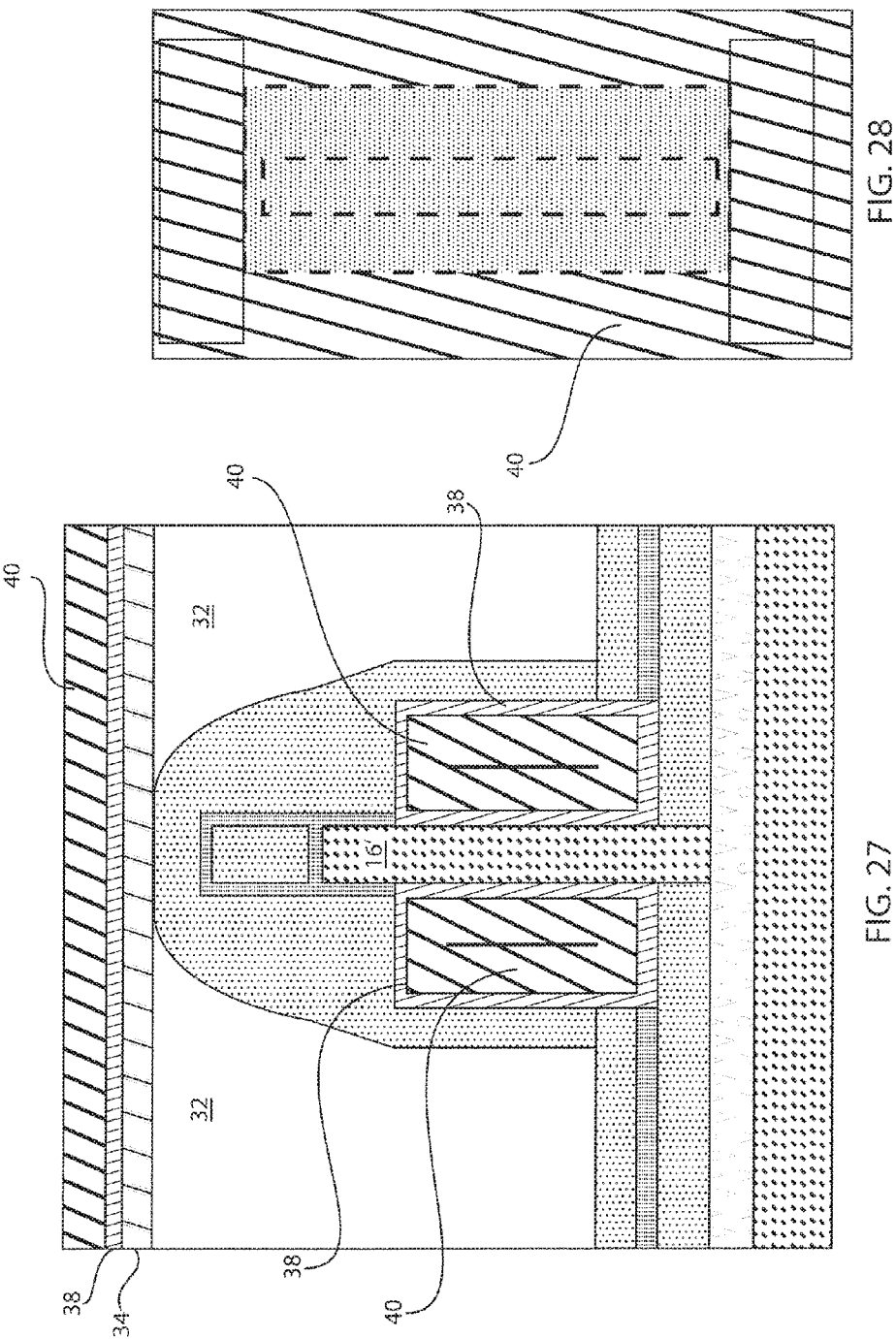
FIG. 27 is a cross-sectional view of the semiconductor device of FIG. 25 where a metal gate is deposited adjacent the high-k dielectric within the recesses adjacent the fin structure, in accordance with an embodiment of the present invention.
FIG. 28 is a top view of the semiconductor device of FIG. 27, in accordance with an embodiment of the present invention.

FIG. 27 is a cross-sectional view of the semiconductor device of FIG. 25 where a metal gate is deposited adjacent the high-k dielectric within the recesses adjacent the fin structure, in accordance with an embodiment of the present invention.

In various embodiments, it is useful to deposit a metal gate 40 to form a HKMG stack within the recesses 37 formed by the stripping of the dummy gate regions 22'. The metal gate 40 fills the high-k dielectric 38. The metal gate 40 is further formed over the high-k dielectric 38 formed over the hard mask 36.

In various embodiments, the metal gate 40 can include, but is not limited to, TiN, TaN, TiAl, Ti, Al, W, Co, TiAlC, TaAlC, TaAl, and any combination thereof. The metal gate 40 can be a single layer or multi-layer of metals.

In various embodiments, the HKMG 38, 40 can have a thickness in the range of about 2. nm to about 10 nm.

FIG. 28 is a top view of the semiconductor device of FIG. 27, in accordance with an embodiment of the present invention.

The top view depicts the metal gate 40 encapsulating the device.

Figure 29:
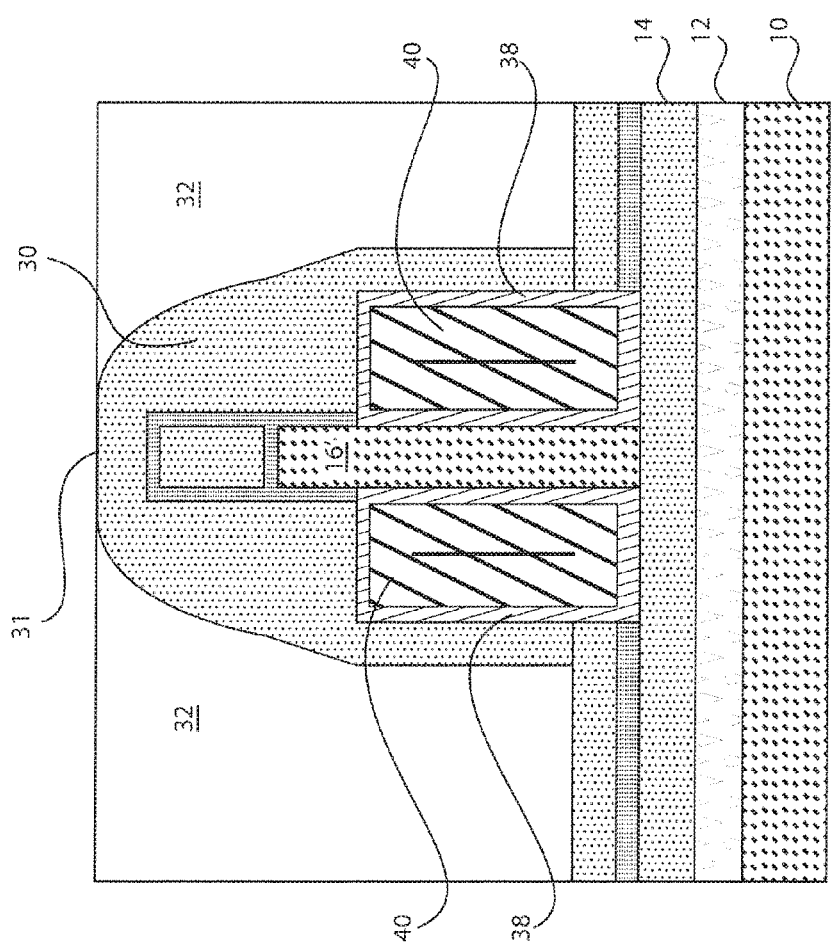
FIG. 29 is a cross-sectional view of the semiconductor device of FIG. 27 where the hard mask and excess portions of the HKMG are removed, in accordance with an embodiment of the present invention.

FIG. 29 is a cross-sectional view of the semiconductor device of FIG. 27 where the hard mask and excess portions of the HKMG are removed, in accordance with an embodiment of the present invention.

In various embodiments, the top layers (e.g., 34, 38, 40) formed over the structure are removed by, e.g., CMP. Therefore, the planarization process can be provided by CMP. Other planarization process can include grinding and polishing. In particular, the hard mask 36, the high-k dielectric 38 formed over the hard mask layer 36, and the metal gate layer 40 formed over the high-k dielectric 38 are selectively removed or stripped. The removal of such top layers results in the exposure of the top surface 31 of the nitride layer 30. Additionally, the removal of such top layers also results in the exposure of the ILD oxide 32.

Figure 30:
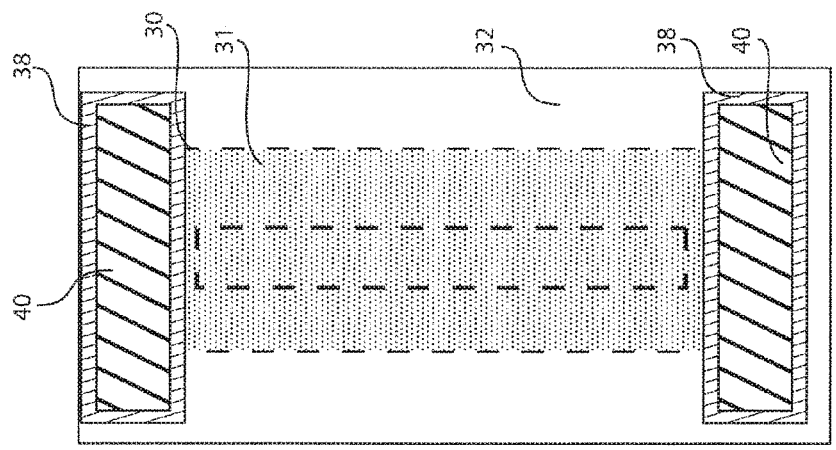
FIG. 30 is a top view of the semiconductor device of FIG. 29, in accordance with an embodiment of the present invention.

FIG. 30 is a top view of the semiconductor device of FIG. 29, in accordance with an embodiment of the present invention.

The top view depicts the top surface 31 of the nitride layer 30, as well as the exposed portions or sections of the ILD oxide 32. The top view also depicts the HKMG 38, 40.

Figure 31:
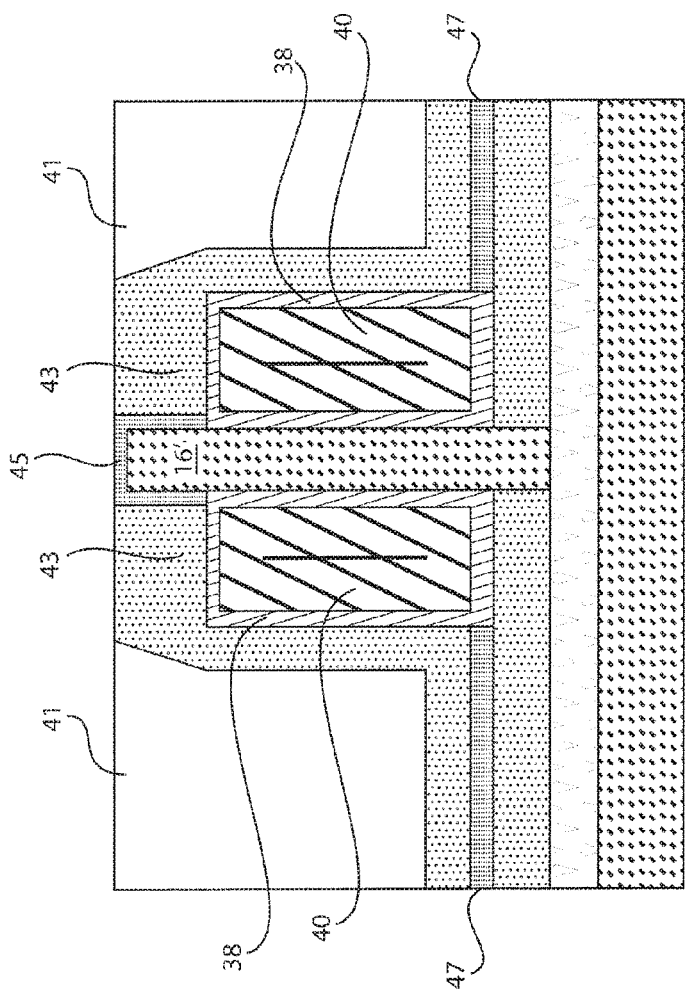
FIG. 31 is a cross-sectional view of the semiconductor device of FIG. 29 where the nitride hard mask above the fin structure is removed, in accordance with an embodiment of the present invention.

FIG. 31 is a cross-sectional view of the semiconductor device of FIG. 29 where the nitride hard mask above the fin structure is removed, in accordance with an embodiment of the present invention.

In various embodiments, an etch takes place to remove portions of the nitride layer 30 portions of the ILD oxide 32, and the entirety of the nitride hard mask 20. As such, there is remaining dummy gate section 41 and remaining nitride layer 43. Additionally, a remaining oxide layer 45 remains directly above the fin 16'. The nitride layer 30 and the ILD oxide 32 can be etched by non-selective RIE or CMP. Moreover, one side of the high-k dielectric 38 is removed and replaced with oxide layer 47. Thus, oxide layer 47 contacts or engages at least one side of the HKMG 38, 40.

Figure 32:
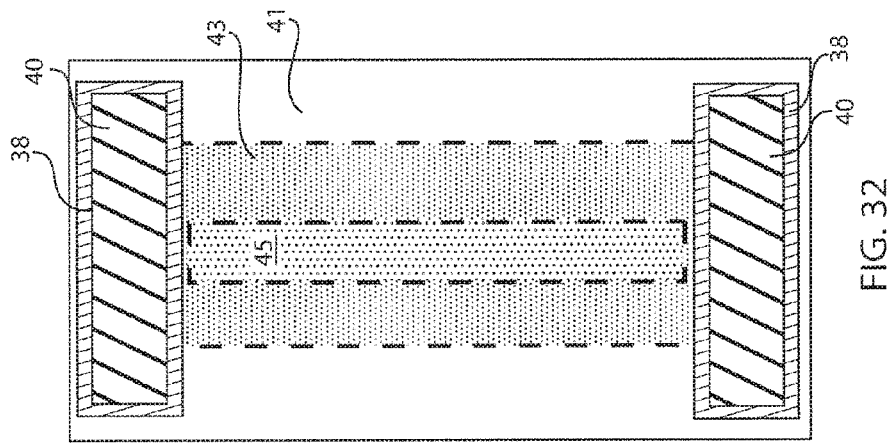
FIG. 32 is a top view of the semiconductor device of FIG. 31, in accordance with an embodiment of the present invention.

FIG. 32 is a top view of the semiconductor device of FIG. 31, in accordance with an embodiment of the present invention.

The top view depicts the dummy gate section 41 and remaining nitride layer 43, as well as the remaining oxide layer 45. The top view also depicts the HKMG 38, 40. Here, the HK(38) and MG (40) are recessed vertically for amount to form a dent from top down.

Figure 33:
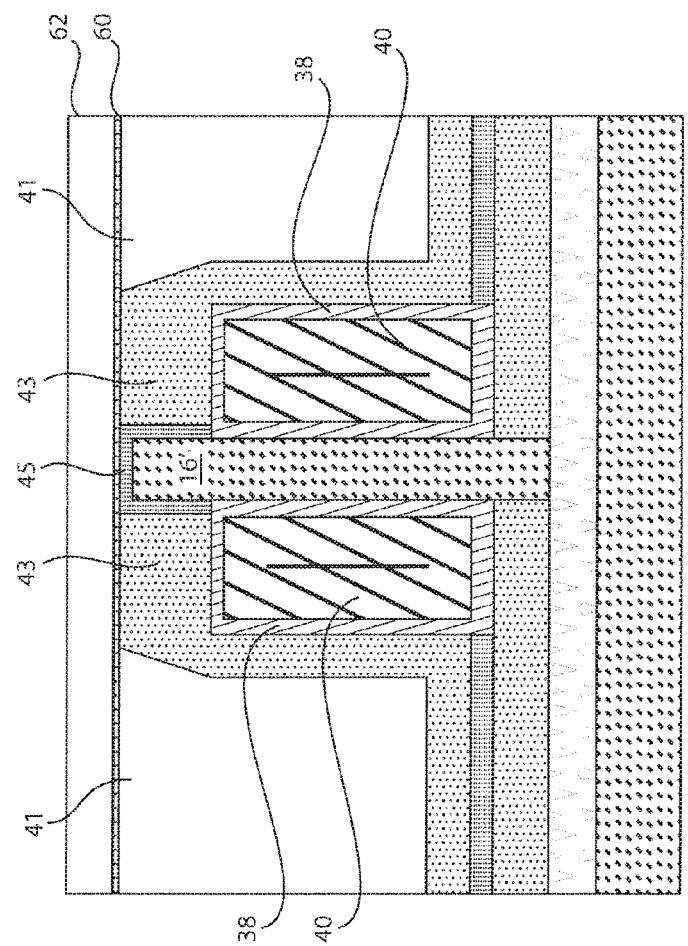
FIG. 33 is a cross-sectional view of the semiconductor device of FIG. 31 where a nitride layer and an oxide layer are deposited, in accordance with an embodiment of the present invention.

FIG. 33 is a cross-sectional view of the semiconductor device of FIG. 31 where a nitride layer and an oxide layer are deposited, in accordance with an embodiment of the present invention.

In various embodiments, a nitride layer 60 is deposited over the top portion of the device, covering the top surface of the dummy gate section 41, the remaining nitride layer 43, and the remaining oxide layer 45. An oxide layer 62 is then deposited over the nitride layer 60.

Figure 34:
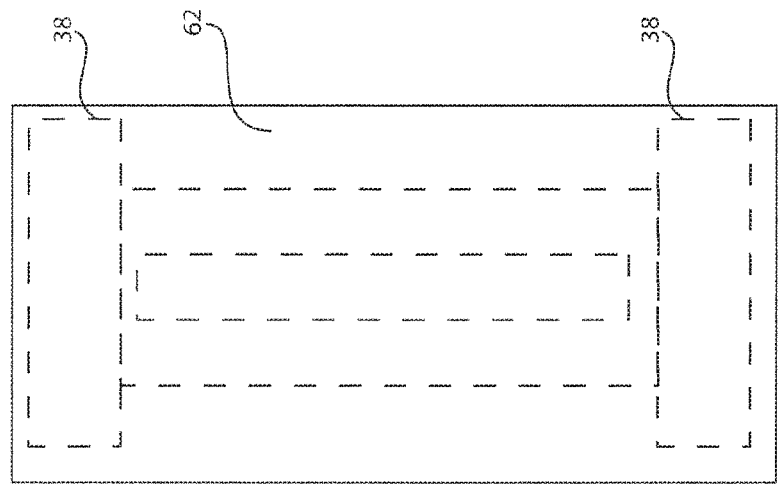
FIG. 34 is a top view of the semiconductor device of FIG. 33, in accordance with an embodiment of the present invention.

FIG. 34 is a top view of the semiconductor device of FIG. 33, in accordance with an embodiment of the present invention.

The top view depicts the oxide layer 62 covering the entirety of the device.

Figure 35:
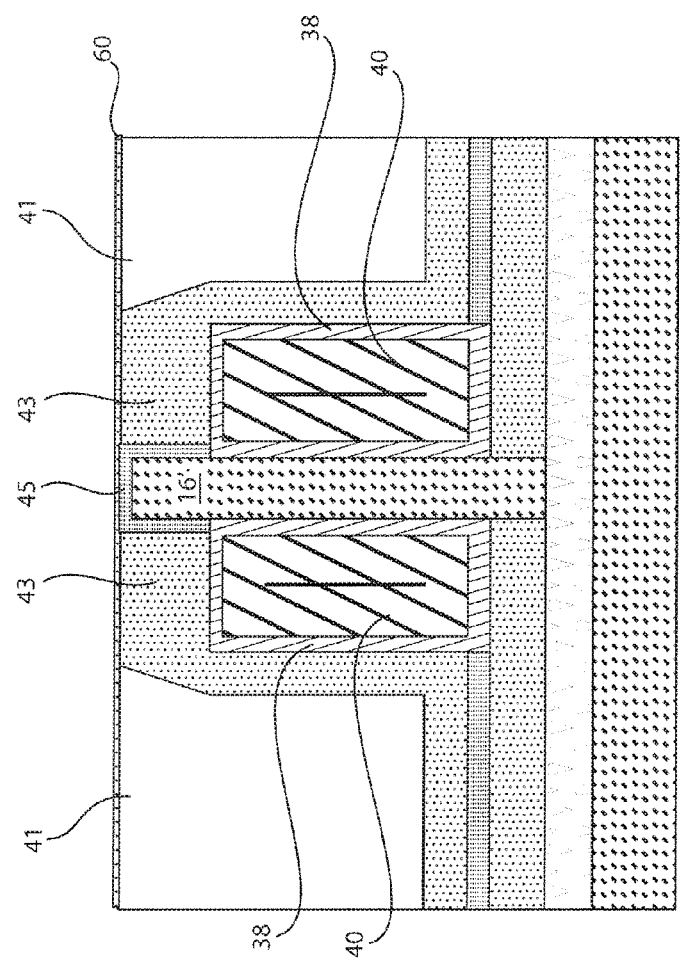
FIG. 35 is a cross-sectional view of the semiconductor device of FIG. 33 where the oxide layer is removed to expose a top surface of the nitride layer, in accordance with an embodiment of the present invention.

FIG. 35 is a cross-sectional view of the semiconductor device of FIG. 33 where the oxide layer is removed to expose a top surface of the nitride layer, in accordance with an embodiment of the present invention.

In various embodiments, the oxide layer is removed by, e.g., CMP, thus exposing the top surface of the nitride layer 60.

Figure 36:
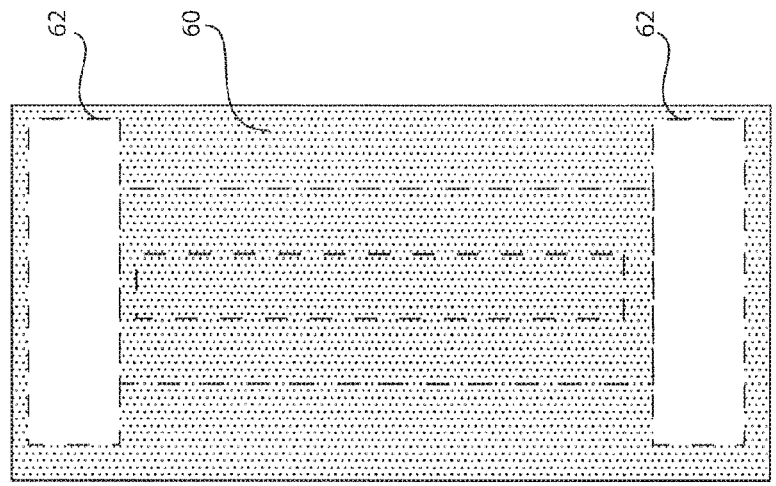
FIG. 36 is a top view of the semiconductor device of FIG. 35, in accordance with an embodiment of the present invention.

FIG. 36 is a top view of the semiconductor device of FIG. 35, in accordance with an embodiment of the present invention.

The top view depicts the nitride layer 60, as well as the oxide layer 62.

Figure 37:
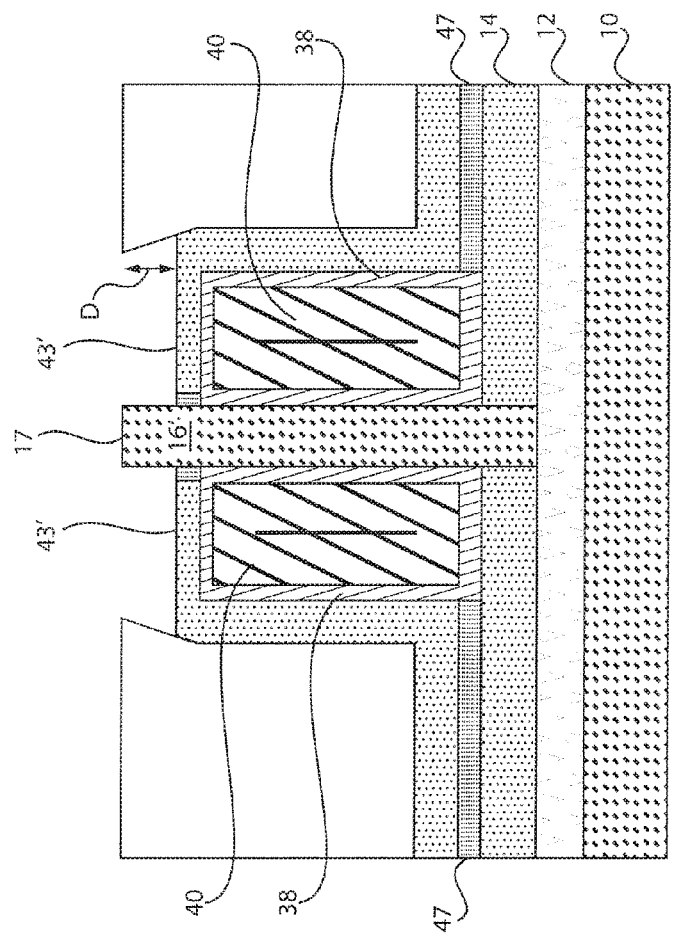
FIG. 37 is a cross-sectional view of the semiconductor device of FIG. 35 where the top portion of the fin structure is exposed after recess of the nitride layer, in accordance with an embodiment of the present invention.

FIG. 37 is a cross-sectional view of the semiconductor device of FIG. 35 where the top portion of the fin structure is exposed after recess of the nitride layer, in accordance with an embodiment of the present invention.

In various embodiments, a further etch is performed to expose the top portion 17 of the fin 16' by a distance "D." The nitride layer 43 is etched further back to form nitride layer 43'. The fin 16' extends up to a top portion of the dummy gate section 41.

Figure 38:
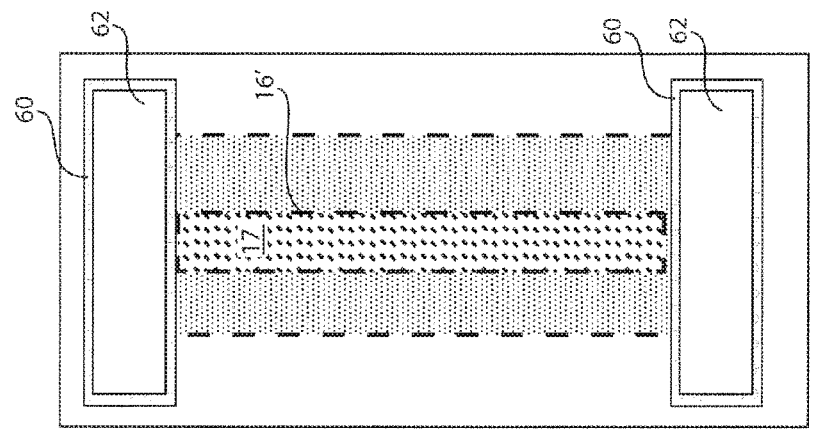
FIG. 38 is a top view of the semiconductor device of FIG. 37, in accordance with an embodiment of the present invention.

FIG. 38 is a top view of the semiconductor device of FIG. 37, in accordance with an embodiment of the present invention.

The top view depicts the top portion 17 of the fin 16'. The top view also depicts the nitride layer 60 and the oxide layer 62.

Figure 39:
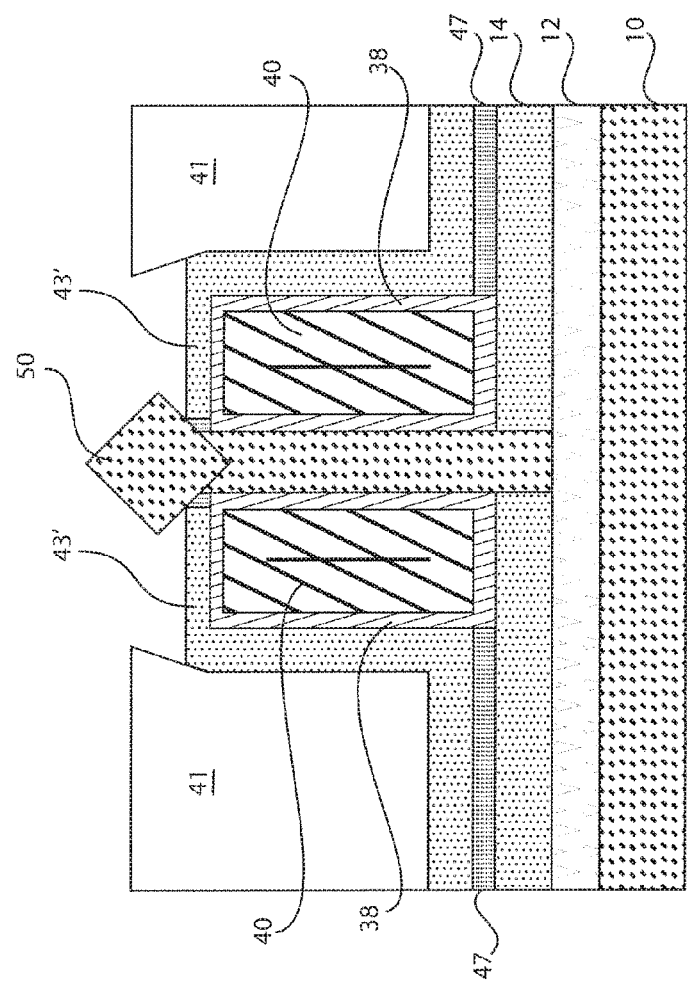
FIG. 39 is a cross-sectional view of the semiconductor device of FIG. 37 where an epitaxial growth layer is formed over the top portion of the fin structure, in accordance with an embodiment of the present invention.

FIG. 39 is a cross-sectional view of the semiconductor device of FIG. 37 where an epitaxial growth layer is formed over the top portion of the fin structure, in accordance with an embodiment of the present invention.

In one or more embodiments, a top source/drain 50 is epitaxially grown after the HKMG 38, 40 is defined in the VFET structure. In another embodiment, the HKMG 38, 40 is defined by a replacement metal gate (RMG) process. It is advantageous and useful to form the epitaxial growth layer 50 after formation of the HKMG 38, 40.

In one or more embodiments, enablement of a higher thermal budget for the top epitaxially grown source/drain regions is advantageously achieved, as well as higher epitaxial growth quality, higher in-situ doping, and lower resistance. In another embodiment, multi-Vt is advantageously enabled through a poly open process rather than a fin blocking process.

In one or more embodiments, a VFET process is defined which advantageously enables the top source/drain epitaxial region 50 to be formed with a high thermal budget, to minimize defects stemming from epitaxial growth, and to minimize sheet resistance. In one or more embodiments, a VFET replacement metal gate (RMG) process is defined that is compatible with tight fin pitches to advantageously enable multi-Vt processing.

In various embodiments, the in-situ doped source/drain 50 is advantageously deposited or formed via epitaxial growth. Depending on how the epitaxial growth develops, it can be necessary to anisotropically etch the epitaxial growth, in order to result in a top surface of the source/drain region 50 that is suitable for subsequent processing.

The doped region 50 can be formed above the vertical fin 16'. The dopant can be provided to the doped region(s) 50 (i.e., source/drain region(s)) by ion implantation, and source/drains formed by annealing the doped region(s) 50. In various embodiments, the doped region 50 can be n-doped or p-doped. It should be noted that the source and drain can be interchangeable between the top and bottom locations of a vertical fin, where the doped region in the substrate can act as a source or a drain.

In various embodiments, the bottom source can be doped in-situ or ex-situ, for example, through ion implantation or thermal diffusion of dopants into the substrate. The dopant of the source can be activated by annealing. Other suitable doping techniques can also be used, including but not limited to, gas phase doping, plasma doping, plasma immersion ion implantation, cluster doping, infusion doping, liquid phase doping, solid phase doping, or combinations thereof.

Forming the source and drain regions 50 can include forming an in situ doped epitaxial semiconductor material on the source and drain region portions of the fin structures 16'. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. In some embodiments, the epitaxial deposition process is a selective deposition method, in which the epitaxial semiconductor material is formed only on semiconductor material deposition surfaces. The epitaxial deposition process will not form epitaxial semiconductor material on dielectric surfaces.

In some embodiments, the epitaxial semiconductor material that provides the source and drain regions 50 can be composed of silicon (Si), germanium (Ge), silicon germanium (SiGe), silicon doped with carbon (Si:C) or a combination thereof. In one example, the p-type source and drain regions are provided by silicon germanium (SiGe) epitaxial semiconductor material. In one embodiment, a number of different sources can be used for the epitaxial deposition of the epitaxial semiconductor material that provides the source and drain regions 50.

Examples of silicon including source gasses can include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

Examples of germanium including source gasses for epitaxially forming the epitaxial semiconductor material of a germanium containing semiconductor include germane, digermane, halogermane, dichlorogermane, trichlorogermane, tetrachlorogermane and combinations thereof.

Epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 550° C. to 900° C. Although higher temperature typically results in faster deposition, the faster deposition can result in crystal defects and film cracking.

The epitaxial semiconductor material that provides the source and drain regions 50 can be in situ doped to a p-type conductivity or an n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material can introduce p-type dopants to the material being formed during the epitaxial deposition process that includes p-type source gasses.

As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. The p-type gas dopant source can include diborane ($B_2H_6$). In some embodiments, the epitaxial deposition process for forming the epitaxial semiconductor material for the source and drain regions 32 can continue until the epitaxial semiconductor material that is formed on adjacent fin structures contact one another to form merged epitaxial semiconductor material.

As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

Figure 40:
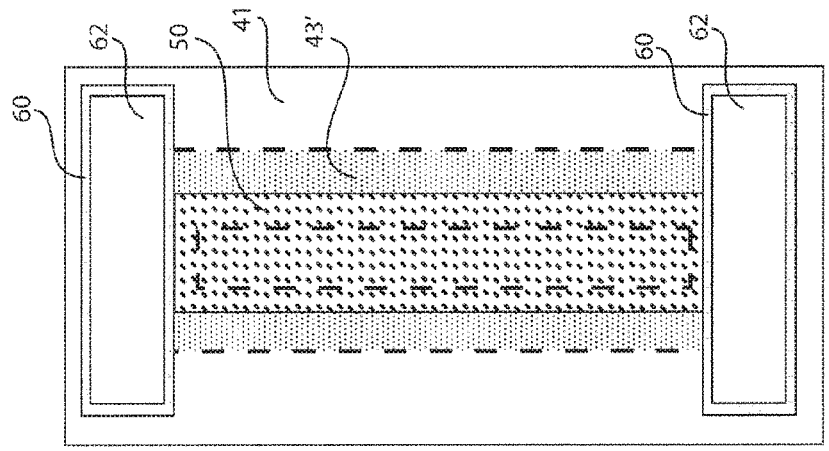
FIG. 40 is a top view of the semiconductor device of FIG. 39, in accordance with an embodiment of the present invention.

FIG. 40 is a top view of the semiconductor device of FIG. 39, in accordance with an embodiment of the present invention.

The top view depicts the epitaxial growth 50. The top view also depicts the nitride layer 60 and the oxide layer 62.

FIG. 41 is a cross-sectional view of the semiconductor device of FIG. 39 where source, drain, and gate contacts are formed, in accordance with an embodiment of the present invention.

In various embodiments, contacts 53, 55 are formed. Additionally, a dielectric layer 51 is formed therebetween. A first contact 55 engages the epitaxial growth 50 and a second contact 53 extends through the dielectric 51 and into the bottom junction 12 deposited over the substrate 10.

FIG. 42 is a top view of the semiconductor device of FIG. 41, in accordance with an embodiment of the present invention.

The top view depicts the contacts 53, 55, as well as the dielectric 51 formed therebetween.

Figure 43:
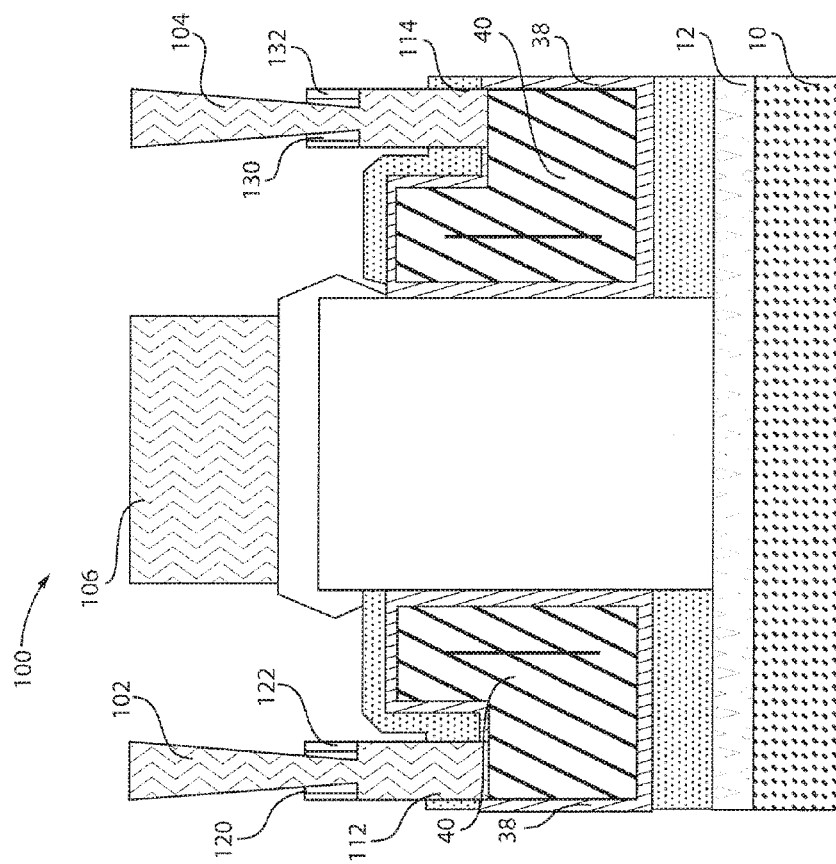
FIG. 43 is a cross-sectional view of a semiconductor device with replacement metal gate (RMG) with top source and drain last, where contact formation takes place, in accordance with one embodiment of the present invention.

FIG. 43 is a cross-sectional view of a semiconductor device with replacement metal gate (RMG) with top source and drain last, where contact formation takes place, in accordance with one embodiment of the present invention.

The structure 100 depicts a first contact 102, a second contact 104, and a third contact 106. The first contact 102 has a second section 112, whereas the second contact 104 also has a second section 114. Sections 112, 114 of first and second contacts 102, 104 extend into the bottom junction 12. Additionally, the intersection of the first contact 102 with the second section 112 includes an oxide layer portion 120 and a nitride layer 122. Similarly, the intersection of the second contact 104 with the second section 114 includes an oxide layer portion 130 and a nitride layer 132.

Figure 44:
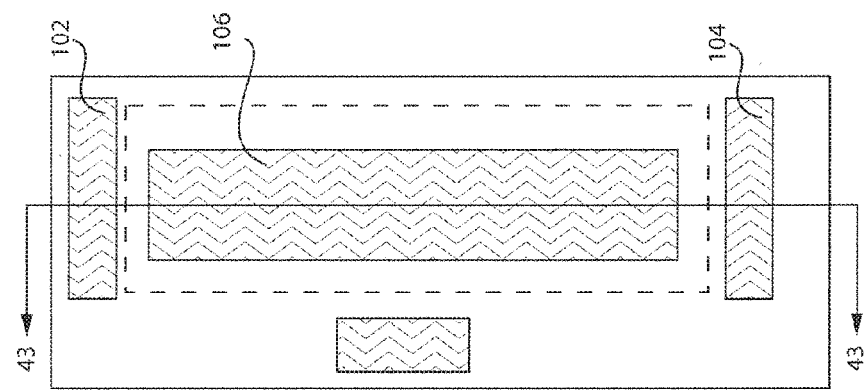
FIG. 44 is a top view of the semiconductor device of FIG. 43, in accordance with an embodiment of the present invention.

FIG. 44 is a top view of the semiconductor device of FIG. 43, in accordance with an embodiment of the present invention.

The top view depicts the first, second, and third contacts 102, 104, 106.

Figure 45:
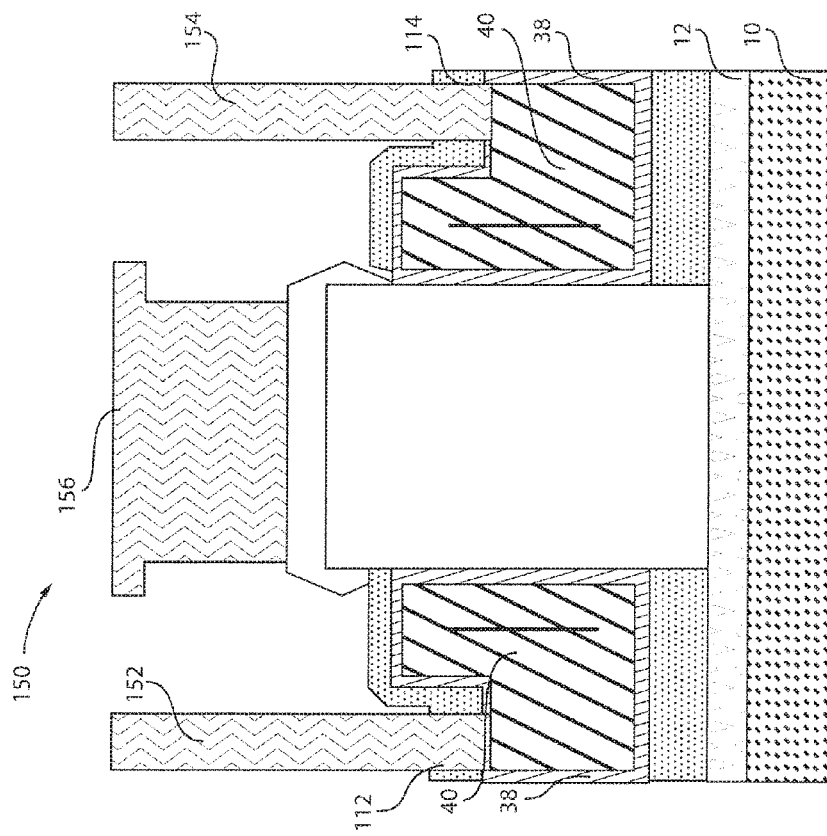
FIG. 45 is a cross-sectional view of a semiconductor device with RMG with top source and drain first, where contact formation takes place, in accordance with another embodiment of the present invention.

FIG. 45 is a cross-sectional view of a semiconductor device with RMG with top source and drain first, where contact formation takes place, in accordance with another embodiment of the present invention.

The structure 150 depicts a first contact 152, a second contact 154, and a third contact 156 with different structures than the contacts 102, 104, 106 of the structure 100 of FIG. 43.

Figure 46:
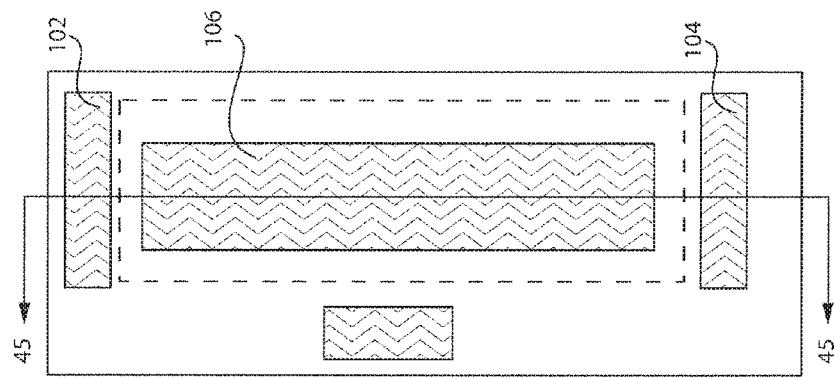
FIG. 46 is a top view of the semiconductor device of FIG. 45, in accordance with an embodiment of the present invention.

FIG. 46 is a top view of the semiconductor device of FIG. 45, in accordance with an embodiment of the present invention.

The top view depicts the first, second, and third contacts 152, 154, 156.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated to form a replacement metal gate scheme with a self-alignment gate for a VFET (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor structure, comprising:
   a fin structure formed over a substrate;
   a dummy gate formed over the fin structure, the dummy gate etched by a first amount to expose a top portion of the fin structure;
   an first dielectric layer formed adjacent the exposed top portion of the fin structure;
   a spacer formed adjacent the first dielectric layer contacting the fin structure, the dummy gate etched further by a second amount after spacer formation;
   a second dielectric layer deposited to encapsulate the remaining dummy gate;
   an inter-level dielectric (ILD) formed over the second dielectric layer;
   at least one hard mask formed over the ILD to access the dummy gate, the dummy gate stripped to form at least one recess; and
   a high-k metal gate (HKMG) deposited within the at least one recess.

2. The structure of claim 1, wherein the dummy gate is laterally etched.

3. The structure of claim 1, wherein the HKMG directly contacts the fin structure.

4. The structure of claim 1, further comprising forming a hard mask over the top portion of the fin structure before forming the dummy gate over the fin structure.

5. The structure of claim 4, wherein, after formation of the HKMG, the dummy gate is etched by a third amount to remove the hard mask formed over the top portion of the fin structure.

6. The structure of claim 5, wherein the hard mask is etched to expose the top portion of the fin structure.

7. The structure of claim 6, wherein an epitaxial growth layer is formed directly over the top portion of the fin structure.

8. The structure of claim 7, wherein, after formation of the epitaxial growth layer, a gate contact, source contact, and a drain contact are formed.

9. The structure of claim 1, wherein stripping of the dummy gate results in removal of dielectric adjacent the fin structure.

10. The structure of claim 9, wherein the dummy gate is stripped by wets like hot ammonia.

* * * * *

UNITED STATES PATENT AND TRADEMARK OFFICE
CERTIFICATE OF CORRECTION

PATENT NO. : 9,960,254 B1  
APPLICATION NO. : 15/424937  
DATED : May 1, 2018  
INVENTOR(S) : Ruqiang Bao and Dechao Guo Page 1 of 1

It is certified that error appears in the above-identified patent and that said Letters Patent is hereby corrected as shown below:

On the Title Page

Item (72) Inventors: DELETE "Raqiang Bao" and INSERT --Ruqiang Bao--

Signed and Sealed this
Twentieth Day of June, 2023

Katherine Kelly Vidal  
*Director of the United States Patent and Trademark Office*